(12) United States Patent
Ghegin et al.

(10) Patent No.: US 11,075,501 B2
(45) Date of Patent: Jul. 27, 2021

(54) PROCESS FOR PRODUCING A COMPONENT COMPRISING III-V MATERIALS AND CONTACTS COMPATIBLE WITH SILICON PROCESS FLOWS

(71) Applicant: COMMISSARIAT A L'ENERGIE ATOMIQUE ET AUX ENERGIES ALTERNATIVES, Paris (FR)

(72) Inventors: Elodie Ghegin, Le Versoud (FR); Christophe Jany, Chambery (FR); Fabrice Nemouchi, Moirans (FR); Philippe Rodriguez, Le Grand Lemps (FR); Bertrand Szelag, Herbeys (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 4 days.

(21) Appl. No.: 16/472,136

(22) PCT Filed: Dec. 22, 2017

(86) PCT No.: PCT/EP2017/084529
§ 371 (c)(1),
(2) Date: Jun. 20, 2019

(87) PCT Pub. No.: WO2018/115510
PCT Pub. Date: Jun. 28, 2018

(65) Prior Publication Data
US 2020/0274321 A1     Aug. 27, 2020

(30) Foreign Application Priority Data

Dec. 22, 2016 (FR) .................................. 1663133

(51) Int. Cl.
*H01L 21/285* (2006.01)
*H01S 5/042* (2006.01)
(Continued)

(52) U.S. Cl.
CPC ............ *H01S 5/0421* (2013.01); *H01S 5/021* (2013.01); *H01S 5/18344* (2013.01); *H01S 5/3434* (2013.01)

(58) Field of Classification Search
None
See application file for complete search history.

(56) References Cited

U.S. PATENT DOCUMENTS

| 6,596,616 B1 | 7/2003 | Holm et al. |
| 2007/0040274 A1* | 2/2007 | Lee .................. H01L 29/7371 257/751 |

(Continued)

OTHER PUBLICATIONS

Baca, et al., "A survey of ohmic contacts to III-V compound semiconductors", Thin Solid Films, vol. 308-309, pp. 599-606, 1997.

(Continued)

*Primary Examiner* — Michelle Mandala
(74) *Attorney, Agent, or Firm* — BakerHostetler

(57) ABSTRACT

A process for producing a component includes a structure made of III-V material(s) on the surface of a substrate, the structure comprising at least one upper contact level defined on the surface of a first III-V material and a lower contact level defined on the surface of a second III-V material, comprising: successive operations of encapsulation of the structure with at least one dielectric; making primary apertures in a dielectric for the two contacts; making secondary apertures in a dielectric for the two contacts; at least partial filling of the apertures with at least one metallic material so as to produce upper contact bottom metallization and at least one upper contact pad in contact with the metallization for each of said contacts. A component produced by the process is also provided. The component may be a laser diode.

30 Claims, 28 Drawing Sheets

(51) Int. Cl.
*H01S 5/02* (2006.01)
*H01S 5/183* (2006.01)
*H01S 5/343* (2006.01)

(56) References Cited

U.S. PATENT DOCUMENTS

2016/0087160 A1* 3/2016 Cheng .................... G02B 6/42
                                                    257/13
2016/0148959 A1  5/2016 Cheng et al.

OTHER PUBLICATIONS

Stareev, et al., "A controllable mechanism of forming extremely low-resistance nonalloyed ohmic contacts to group III-V compound semiconductors", Journal of Applied Physics, vol. 74, No. 12, p. 7344, 1993.
Bakir, et al., "Heterogeneously integrated III-V on silicon lasers", MECS Trans.2014, vol. 64, Issue 5, pp. 211-223, 2014.
Duprez, et al., "Heterogeneously integrated III-V on silicon distributed feedback lasers at 1310 nm", Optical Fiber Communications Conference and Exhibition (OFC), 2015, pp. 1-3, Mar. 2015.
Kuroda, et al., "A new fabrication technology for AlGaAs/GaAs HEMT LSIs using InGaAs nonalloyed ohmic contacts", IEEE Transactions on Electron Devices, vol. 36, Issue: 10, pp. 2196-2203, Oct. 1, 1989.

* cited by examiner

PROCESS FOR PRODUCING A COMPONENT COMPRISING III-V MATERIALS AND CONTACTS COMPATIBLE WITH SILICON PROCESS FLOWS

CROSS-REFERENCE TO RELATED APPLICATIONS

This application is a National Stage of International patent application PCT/EP2017/084529, filed on Dec. 22, 2017, which claims priority to foreign French patent application No. FR 1663133, filed on Dec. 22, 2016, the disclosures of which are incorporated by reference in their entirety.

FIELD OF THE INVENTION

The field of the invention is that of the co-integration of III-V materials on a standard substrate such as silicon that can be produced on a silicon platform able to receive wafers with a minimum diameter of 100 mm. The proposed co-integration comes within the framework of integration having a planarized "back-end" compatible with the silicon process flow of 100 mm or more.

BACKGROUND

The contacts currently integrated on III-V materials employ methods such as "lift-off" (the metal is deposited on the resin and the zones of interest, and then the resin is dissolved, which removes the metal present above the resin, leaving the metal on the zones of interest) as well as a great many metals that are very expensive or are prohibited from silicon clean rooms as described in the article: A. Baca, F. Ren, J. Zolper, R. Briggs, and S. Pearton, "A survey of ohmic contacts to III-V compound semiconductors", *Thin Solid Films*, Vol. 308-309, pp. 599-606, 1997, or in the article by G. Stareev, H. Kunzel, and G. Dortmann, "A controllable mechanism of forming extremely low-resistance nonalloyed ohmic contacts to group III-V compound semiconductors", *Journal of Applied Physics*, Vol. 74, No. 12, p. 7344, 1993.

Nonplanar integration of this kind does not open the way to the production of several higher levels or to the co-integration of other objects. Miniaturization and densification of the components are thus limited.

Finally, multiplication of the number of layers present in the existing contacts (between 3 and 5) makes integration complex and nonoptimal. A typical example of nonplanar integration of contacts is given in the references: B. Ben Bakir, C. Sciancalepore, A. Descos, H. Duprez, D. Bordel, L. Sanchez, C. Jany, K. Hassan, P. Brianceau, V. Carron, and S. Menezo, "Heterogeneously integrated III-V on silicon lasers", *Meeting Abstracts*, Vol. MA2014-02, No. 34, p. 1724, 2014 and H. Duprez, A. Descos, T. Ferrotti, J. Harduin, C. Jany, T. Card, A. Myko, L. Sanchez, C. Sciancalepore, S. Menezo, and B. Ben Bakir, "Heterogeneously integrated III-V on silicon distributed feedback lasers at 1310 nm", in *Optical Fiber Communications Conference and Exhibition (OFC)*, 2015, pp. 1-3, Mar. 2015.

FIG. 1 shows this type of configuration for the laser application with nonplanar connections consisting of noble metals for direct reworking on the III-V materials. On an n-doped InP substrate, a structure with an active region based on multiple quantum wells MQW is produced, on which a p-doped InP layer and a p-doped InGaAs layer will be stacked. Connections are produced via the n-Pad contact pads for connecting the n-doped substrate, making it possible to define a lower contact and connections via p-Pad contact pads for connecting the p-doped layer of InGaAs, allowing an upper contact to be defined.

SUMMARY OF THE INVENTION

In this context, the present invention proposes a process for making contacts on III-V materials notably compatible with the silicon process flow, thus allowing III-V materials/silicon co-integration on a platform processing wafers with a minimum diameter of 100 mm.

This invention thus opens the way to a finished product integrated in a silicon compatible clean room processing wafers of 100 mm or more, compact and having at least two levels of planar contacts produced simultaneously or sequentially.

More precisely, the present invention relates to a process for producing a component comprising a structure of III-V material(s) on the surface of a substrate, said structure comprising at least one upper contact level defined on the surface of a first III-V material and a lower contact level defined on the surface of a second III-V material, said lower contact level being below said upper contact level, the process comprising:

successive operations of encapsulation with at least one dielectric comprising encapsulation of said structure with at least one dielectric;

making, in said dielectric, at least one upper aperture on the surface of said first III-V material and at least one lower aperture on the surface of said second III-V material, so as to define contact bottom zones on said first III-V material and on said second III-V material;

carrying out contact bottom metallizations in said at least upper aperture and in said at least lower aperture;

at least partial filling of said at least upper aperture and at least partial filling of said at least lower aperture with at least one metallic material so as to produce at least one upper contact pad and at least one lower contact pad;

the contact bottom metallizations and the contact pads defining at least one upper contact of said first III-V material in contact with said upper contact level and at least one lower contact of said second III-V material in contact with said lower contact level;

at least said upper contact and at least said lower contact are integrated in dielectric and have an upper surface defined in one and the same plane.

The planar character is defined as being the set of contacts emerging on one and the same plane.

Thus, the following are defined in the present patent application:

an upper contact starting from an upper aperture comprising a contact bottom metallization and a contact pad;

a lower contact starting from a lower aperture comprising a contact bottom metallization and a contact pad.

To arrive at this result, the lower contacts (for the filling part) may be produced in one or more steps.

For this, a lower aperture may be made in two successive operations defining a first lower aperture and a second upper aperture, as will be elaborated upon in the detailed description of the invention.

Metallic material is defined as:

pure metals, metal alloys, alloys of metal+nonmetallic element;

intermetallic compounds or metalloids (different from an alloy in its crystallographic structure).

Integration of the planar type opens the way to 3D integration, by means of hybrid or direct bonding (for example photonic/electronic) or chip transfer by means of bumps.

In the context of III-V/Si co-integration, production of a planarized back-end (corresponding to the set of steps constituting the interconnections by metal bonds) also makes it possible to envisage forming the contact on the devices of the lower levels (back-end front side or intermetallic for example).

According to variants of the invention, the structure has a lower base of second III-V material and a mesa of first III-V material located above said base.

According to the present invention, it may be envisaged to produce contacts on the two III-V materials, according to at least two alternatives:

either by making apertures, in which contact bottom metallizations are carried out at the bottom of apertures, then filling of said apertures for making contact pads in contact with said contact bottom metallizations;

or by making so-called primary apertures, in which contact bottom metallizations will be carried out at the bottom of apertures, then defining secondary apertures after filling with dielectric, for making contact pads, several contact pads thus contacting one and the same contact bottom metallization previously defined in a primary aperture.

In the context of the first alternative:

According to variants of the invention, the process comprises successively making at least one lower aperture and then at least one upper aperture.

According to variants of the invention, at least the lower aperture is made in several steps defining a first lower aperture and a second lower aperture, superposed on one another.

According to variants of the invention, said lower aperture comprises, superposed, a contact bottom metallization, a metallic filling, a metallic interface identical to the contact bottom metallization, a metallic filling.

According to variants of the invention, the process comprises successively making at least one upper aperture and then at least one lower aperture.

According to variants of the invention, the process comprises simultaneously making of at least one upper aperture and at least one lower aperture.

According to variants of the invention, the width of at least one upper aperture and/or of at least one lower aperture is (are) between 0.5 µm and 10 µm and preferably between 1 µm and 5 µm.

In the context of the second alternative:

According to variants of the invention, the process for producing a component comprising a structure of III-V material(s) on the surface of a substrate, said structure comprising at least one upper contact level defined on the surface of a first III-V material and a lower contact level defined on the surface of a second III-V material, comprising:

successive operations of encapsulation of said structure with at least one dielectric;

making at least one primary upper aperture and at least one primary lower aperture in a dielectric so as to define contact bottom zones on said first III-V material and on said second III-V material; making at least one secondary upper aperture and at least one secondary lower aperture in a dielectric so as to define zones of contact pads on said contact bottom zones;

at least partial filling, with at least one metallic material, of said at least primary upper aperture, of said at least primary lower aperture, of said at least secondary upper aperture and of said at least secondary lower aperture so as to produce:

at least one upper contact of said first III-V material in contact with the upper contact level and comprising at least one upper contact bottom metallization and at least one upper contact pad in contact with said metallization;

at least one lower contact of said second III-V material in contact with said lower contact level and comprising at least one lower contact bottom metallization and at least one lower contact pad in contact with said metallization;

at least said upper contact and at least said lower contact are integrated in dielectric and have a surface defined in one and the same plane.

According to variants of the invention, the process comprises successively making at least one primary upper aperture and at least one primary lower aperture.

It may be advantageous to optimize the contact metallizations independently on each of the materials present in the III-V component in order to minimize the associated contact resistances.

According to variants of the invention, the process comprises simultaneously making at least one secondary upper aperture and at least one secondary lower aperture.

According to variants of the invention, the process comprises:

encapsulation of an assembly comprising the first III-V material covered with a metallization and the second III-V material covered with a metallization, with dielectric;

making at least one secondary lower aperture opposite the second III-V material;

making at least one secondary upper aperture above said first III-V material and making at least one additional secondary lower aperture above at least said secondary lower aperture;

filling at least said secondary upper aperture, at least one additional secondary lower aperture and at least said secondary lower aperture.

According to variants of the invention, the structure comprising at least one so-called upper III-V material, a so-called intermediate III-V material, a so-called lower III-V material, the process comprises:

making at least one primary upper aperture, at least one primary intermediate aperture, at least one primary lower aperture;

making at least one secondary upper aperture, at least one secondary intermediate aperture and at least one secondary lower aperture; filling said apertures.

According to variants of the invention:

at least said secondary lower aperture comprises three portions with different dimensions;

at least said secondary intermediate aperture comprises two portions with different dimensions;

at least said secondary upper aperture comprises a portion.

According to variants of the invention, the process comprises the following steps:

encapsulating said structure with a first dielectric;

making at least one primary lower aperture opening onto said second III-V material;

depositing metallization on the surface of said first dielectric and on the surface of said second semiconductor material defining a lower contact metallization and a first assembly;

encapsulation of said first assembly with a second dielectric;

planarization of said encapsulated first assembly;

making at least one secondary lower aperture opening onto said lower contact bottom metallization;

filling, with at least one metallic material, said at least secondary lower aperture defining at least one contact pad of said lower contact and a second assembly;

encapsulation of said second assembly with a third dielectric; making at least one primary upper aperture above said first III-V material;

depositing metallization on the surface of said third dielectric material and of said upper aperture defining an upper contact bottom metallization and a third assembly;

encapsulation of said third assembly with a fourth dielectric; planarization of said third assembly;

making at least one secondary upper aperture above said upper contact bottom metallization and at least one upper aperture above at least said contact pad of said lower contact;

filling, with at least one metallic material, said at least secondary upper aperture above said upper contact bottom metallization and said at least upper aperture above at least said contact pad of said lower contact, defining at least one upper pad for upper contact and at least one prolongation of lower contact pad, said upper contact and at least said lower contact having a surface defined in one and the same plane.

According to variants, the process comprises the following steps:

encapsulation of said structure with a first dielectric;

making at least one primary upper aperture opening onto said first III-V material;

depositing metallization on the surface of said first dielectric and on the surface of said first semiconductor material defining an upper contact metallization and a first assembly;

encapsulation of said first assembly with a second dielectric; planarization of said encapsulated first assembly;

making at least one secondary upper aperture opening onto said upper contact bottom metallization;

filling, with at least one metallic material, said at least secondary upper aperture defining at least one contact pad of said upper contact and a second assembly;

making at least one primary lower aperture above said second III-V material;

depositing metallization on the surface of said first dielectric material and of said primary lower aperture defining a lower contact metallization and a third assembly;

encapsulation of said third assembly with a fourth dielectric; planarization of said third;

making at least one secondary lower aperture above said lower contact bottom layer;

filling, with at least one metallic material, said at least secondary lower aperture, defining at least one lower contact pad, said upper contact and at least said lower contact having a surface defined in one and the same plane.

According to variants, the process comprises:

simultaneously making at least one primary upper aperture and at least one primary lower aperture;

simultaneously making at least one secondary upper aperture and at least one secondary lower aperture.

According to variants of the invention, the process comprises making an additional contact level on the surface of said planar contacts, comprising:

additional deposition of dielectric;

making at least one lower additional aperture and at least one upper additional aperture;

filling said additional apertures with at least one metallic material to define at least one lower additional contact and at least one upper additional contact.

According to variants of the invention, the process comprises making primary lower apertures having a width between 20 µm and 50 µm and making secondary lower apertures having a width between 0.5 µm and 5 µm, preferably between 1 µm and 3 µm.

According to variants of the invention, the first III-V material and the second III-V material are selected from:

The first III-V material may consist of III-V material such as InP, $In_{1-x}GaAs$ (with $0 \le x \le 1$), GaAs, InAs, GaSb, $In_{1-x}Ga_xSb$, $In_xGa_{1-x}As_{1-y}P_y$, $Ga_{1-x}In_xP$, $In_xGa_{1-x}As_{1-y}N_y$, $B_xIn_yGa_{1-x-y}As$.

The second III-V material may also consist of III-V material such as InP, $In_{1-x}Ga_xAs$ (with $0 \le x \le 1$), GaAs, InAs, GaSb, $In_{1-x}Ga_xSb$, $In_xGa_{1-x}As_{1-y}P_y$, $Ga_{1-x}In_xP$, $In_xGa_{1-x}As_{1-y}N_y$, $B_xIn_yGa_{1-x-y}As$, etc.

According to variants of the invention the substrate is of silicon.

According to variants of the invention, the dielectric or dielectrics are selected from: SiN, $SiO_2$, $Al_2O_3$, a planarizing polymer that may be based on benzocyclobutene (BCB) or SOG.

According to variants of the invention, a metal such as $Ni_2P$, $Ni_3P$, NiGe, TiP, TiGe is deposited in said primary apertures.

According to variants of the invention, a metal such as Ni, Ti and alloy such as NiPt, NiTi, NiCo are deposited in said primary apertures.

According to variants of the invention, the filling operations comprise:

depositing a diffusion barrier, which may consist of one or more layers of material selected from: TiN, Ti/TiN, TaN, Ta/TaN, W (fluorine-free); depositing a filling metal selected from: W, Cu, Al, AlCu, AlSi.

Regarding the diffusion barrier, W is fluorine-free as the barrier is deposited by CVD (chemical method), the precursor of which does not contain F, in contrast to the W for filling. A barrier is used because F is harmful to devices. This barrier may also serve for facilitating nucleation of the filling metal (W, Cu, Al, etc.).

The element W is particularly advantageous in the context of the present invention as it is of quite low resistance and is easy to use, it can thus be used advantageously for filling the secondary apertures.

According to variants of the invention, the deposition of metallization is followed by a heat treatment, the aim of which is to form one or more intermetallic compounds.

According to variants of the invention, the component is a laser, and the process of the invention comprises an operation for making a guide of semiconductor material, which may be Si, in a dielectric substrate, which may be of $SiO_2$.

According to variants of the invention, the component is a laser, and the process of the invention comprises making a circular upper contact to allow vertical emission of the laser radiation.

The invention also relates to the component obtained by the process of the invention.

The component may be an edge emitting laser, or a vertical emitting laser. It may also be, advantageously, a component comprising a series of different III-V materials having different absorption wavelengths for broadening the absorption band of the component.

The present invention may be applied to a great many initial configurations, such as:
 III-V transfers on any type of substrate for example on Si chips to wafers;
 from wafers to wafers;
 epitaxy of III-V on Si substrate, III-V, or any permanent or temporary substrate allowing crystal growth of III/V. It should be noted that there should be at least one crystal nucleus of crystallographic structure identical to that of the III/V material that it is desired to grow and lattice parameters close to the growing layer. Above 5% of difference between the lattice parameters, the crystal is defective (dislocation, antiphase grain boundary or even polycrystalline). This is impossible on an amorphous substrate of the glass type.

The starting substrates may have a diameter of 100 mm or more.

The invention will be better understood and other advantages will become clearer on reading the nonlimiting description given hereunder and the appended figures, where:

Various embodiments of the invention are described in the detailed description given hereunder.

DETAILED DESCRIPTION

The integration of the contacts is presented at two levels but is applicable to a great many levels having a topography of different levels of contacts at the level of the III-V materials.

Figure 1:
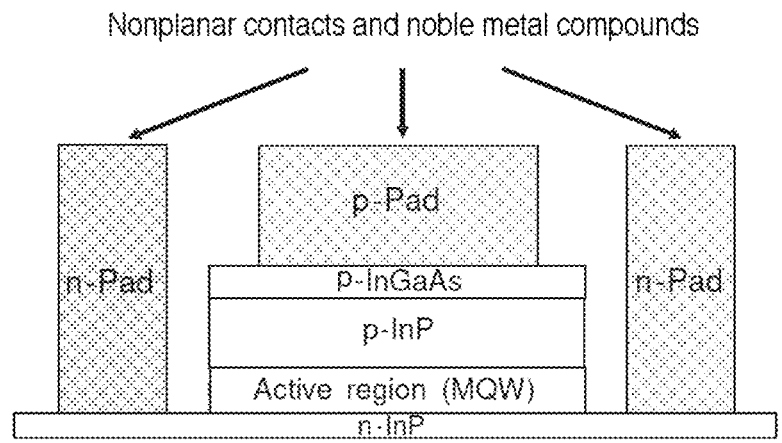
FIG. 1 illustrates an example of a component based on III-V materials of the prior art.
Figure 2:
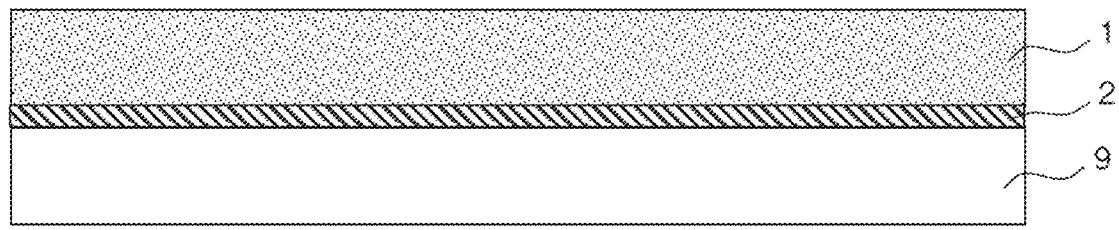
FIG. 2 illustrates an example of a structure of III-V materials on a substrate used in examples of the process of the invention.

The invention is described below in the context of a substrate 9 on which a structure is produced comprising a III-V base material 2 and a III-V upper material 1 as illustrated in FIG. 2, in which it will be possible to produce a mesa having a surface below that of the III-V base material.

The following reference symbols are used throughout the description:
a first III-V material: 1;
a second III-V material: 2;
a substrate: 9;
one or more dielectric materials: 8;
a metallization: 3;
a diffusion barrier: 4;
a metallic filler: 5;
upper apertures $O_s$ in contact with the first material 1;
lower apertures $O_i$ in contact with the second material 2.

An upper contact $C_{sup}$ is defined starting from at least one upper aperture $O_s$ or starting from at least one primary upper aperture $O_{sp}$ and starting from at least one secondary upper aperture $O_{ss}$.

A lower contact $C_{inf}$ is defined starting from at least one lower aperture $O_i$ or starting from at least one primary lower aperture $O_{ip}$ and from at least one secondary lower aperture $O_{is}$.

An intermediate contact $C_{int}$ is defined starting from at least one primary intermediate aperture $O_{tp}$ and starting from at least one secondary intermediate aperture $O_{ts}$.

Figure 3:
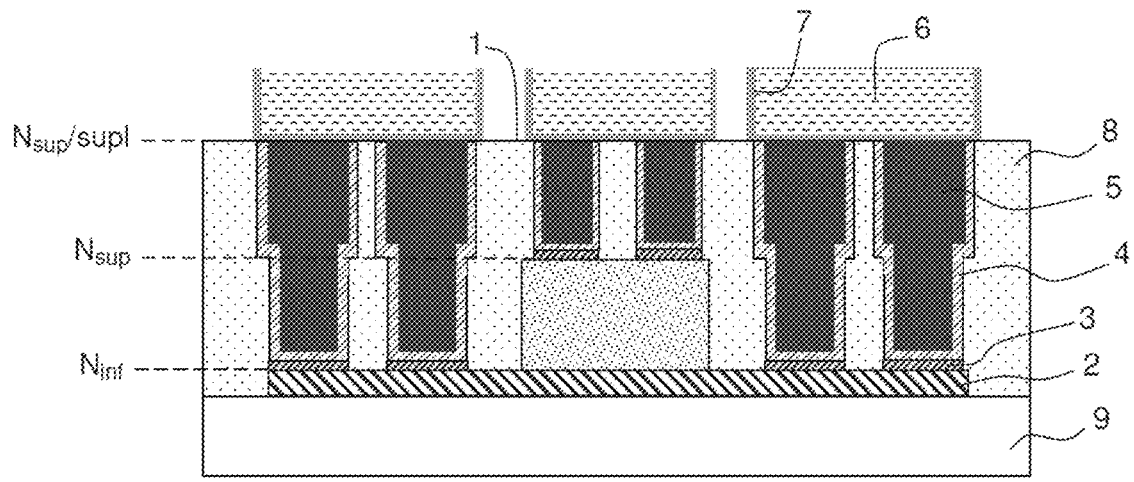
FIG. 3 illustrates a first example of a component made in the context of the first alternative of the present invention.

FIG. 3 shows an example of a component obtained by a process belonging to the first alternative of the invention and showing, on a substrate 9, the III-V materials 1 and 2, metallizations 3 serving as contact bottom metallizations, on which contact pads are produced comprising diffusion barriers 4; the secondary apertures are filled with filling metal 5. The assembly is encapsulated in a dielectric 8. FIG. 3 shows the contact levels: a lower level $N_{inf}$, an upper level $N_{sup}$. According to this example, an additional level $N_{sup/supl}$ may be envisaged, on which contact pads filled with diffusion barrier 7 and with filling metal 6 may be produced.

The first III-V material may consist of III-V material such as InP, $In_{1-x}Ga_xAs$ (with $0 \leq x \leq 1$), GaAs, InAs, GaSb, $In_{1-x}Ga_xSb$, $In_xGa_{1-x}As_{1-y}P_y$, $Ga_{1-x}In_xP$, $In_xGa_{1-x}As_{1-y}N_y$, $B_xIn_yGa_{1-x-y}As$.

The second III-V material may also consist of III-V material such as InP, $In_{1-x}Ga_xAs$ (with $0 \leq x \leq 1$), GaAs, InAs, GaSb, $In_{1-x}Ga_xSb$, $In_xGa_{1-x}As_{1-y}P_y$, $Ga_{1-x}In_xP$, $In_xGa_{1-x}As_{1-y}N_y$, $B_xIn_yGa_{1-x-y}A$. It may be identical to the first material or different from the latter.

The substrate may be a silicon substrate that may for example have a thickness of the order of some hundreds of millimeters (for example 200 mm).

According to the present invention, the upper levels of the upper and lower contacts are located in one and the same plane.

The figures all show sectional views of contacts that may be circular or linear.

I) First Alternative of the Invention Comprising the Production of a Type of Apertures Intended to Receive a Contact Bottom Metallization and Contact Pads in Contact with Said Contact Bottom Metallization First Example of a Process According to the Invention Comprising the Production of Lower Contacts Followed by the Production of an Upper Contact According to the First Alternative of the Invention First Step This involves encapsulation of the structure previously produced, comprising a mesa of a first III-V material 1 on the surface of a base of a III-V material 2 on a substrate 9.

The dielectric(s) 8 used may be: SiN, $SiO_2$, $Al_2O_3$, polymer of the planarizing type for example based on benzocyclobutane (BCB), or of the type: SOG "Spin-on-Glass": deposition of amorphous dielectric by centrifugation.

The deposit may be single-layer or multilayer.

The dielectrics are deposited by PVD (physical vapor deposition), CVD (chemical vapor deposition) and/or ALD (atomic layer deposition). The deposition temperature may typically be $\leq 550°$ C., preferably $\leq 450°$ C.

The stress of the layers produced may advantageously be $\leq 200$ MPa, preferably $\leq 100$ MPa.

Figure 4A:
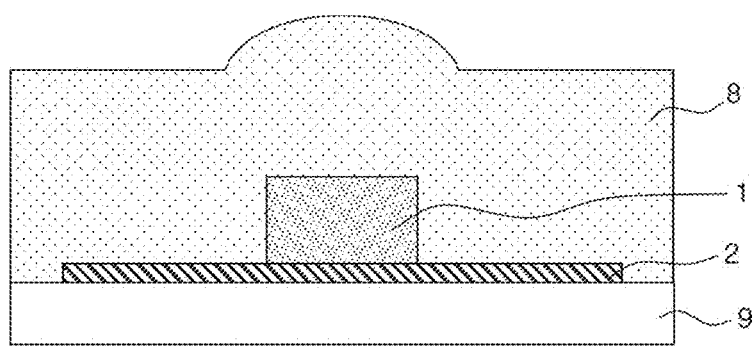
FIGS. 4a to 4i illustrate the various steps of a first example of the process of the invention according to the first alternative and comprising production of the lower contacts and then the upper contacts made on individual contact bottom metallizations.

This encapsulation step is illustrated in FIG. 4a.

Second Step

This involves planarization of the dielectric by a CMP operation ("chemical mechanical planarization" or "chemical mechanical polishing") or partial removal by dry etching ("etch back") in the case of a planarizing polymer.

There are certain polymers that have the property of being self-leveling. That is, they will fill the lower parts first, before the upper parts. However, to ensure that the cavities are filled completely, the deposit is thicker than the depth of the cavity. It is then necessary to reduce the thickness of the surplus deposit. This can be done by dry etching on the whole wafer, called "etch back".

It is also possible to use an operation of localized lithography/etching on the topography before CMP.

Figure 4B:
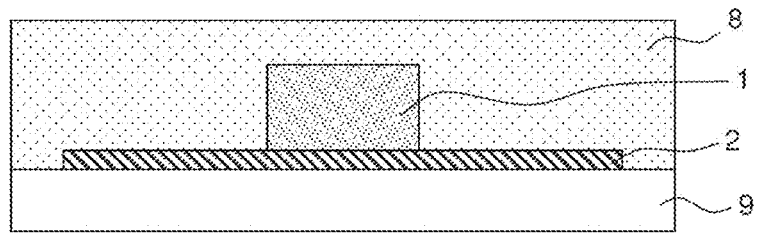

This planarization step is illustrated in FIG. 4b.

Third Step

This involves making first lower apertures $O_{i1}$ intended for the lower contact.

The dimensions D1 and D2 may typically be as follows:

The dimension D1 (width of dielectric on either side of the mesa of III-V material 1) is at least 200 nm and preferably between 2 and 3 μm.

The dimension D2 (width of the lower apertures) may be between 0.5 and 10 μm and is preferably between 1 and 5 μm.

The dimension D3 (thickness of dielectric) is between 0.5 μm and 5 μm, preferably between 5 and 3 μm.

These apertures may be made by dry etching. In this case the presence of an etch stop layer is optional.

Sequential etching may also be employed:
a first dry etching used for etching a part of the dielectric stack, stopping on a barrier layer (SiN, $Al_2O_3$, $SiO_2$, BCB, SOC preferably SiN) and then using dry or wet etching for etching the barrier layer and the optional underlying layers, opening onto the material 2.

Said etching operation(s) may be carried out directly via the resin used for photolithography or preferably using a hard mask for example consisting of SiN.

Fourth Step

This involves depositing metallization compatible with a silicon process flow to define the lower contact, making it possible to avoid the use of noble metals, metals that are not used by the silicon process flow.

Metallization compatible with a silicon process flow may be carried out according to two options:

option 1:
(a) deposition of a metal 3 compatible with a silicon process flow such as $Ni_2P$, $Ni_3P$, NiGe, TiP, TiGe, etc. is carried out;

Phase stabilization may be undertaken by an optional heat treatment carried out after metal deposition;

(b) deposition of a metal 3 compatible with a silicon process flow such as Ni, Ti and alloy such as NiPt, NiTi, NiCo, etc. is carried out;

option 2: deposition of a metal compatible with a silicon process flow (Ni, Ti and their alloys) is carried out; then a heat treatment is carried out with the aim of performing a solid-state reaction between the metal and the III-V material leading to the formation of one or more intermetallic compounds.

The deposition temperatures are preferably ≤450° C.
The annealing temperature is preferably ≤450° C.

According to option 1, the metal or the intermetallic compound is deposited and the work function of the latter is utilized. In this case annealing serves to heal the interface defects and crystallize the metal or the compound.

According to option 2, the metal is deposited, and it is reacted to form the intermetallic compound having the required work function. In this case annealing serves for the solid-state reaction.

Selective removal of the unreacted metal may be carried out after heat treatment.

Figure 4C:
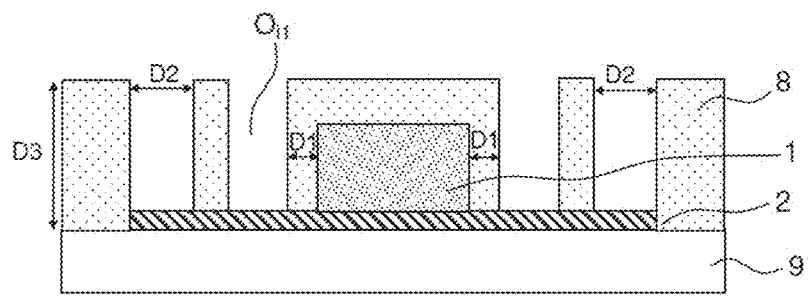
Figure 4D:
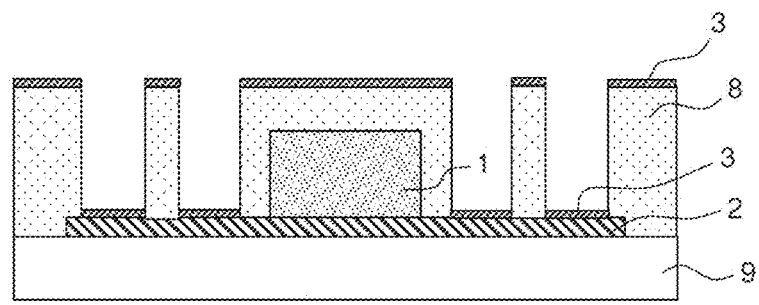

All of these steps are illustrated in FIG. 4*d*.

Fifth Step

This involves filling the first lower apertures and the CMP operation for making connecting pads. The lower apertures are filled twice:
deposition of a diffusion barrier/of a keying or nucleation layer 4 is carried out. It may consist of TiN, Ti/TiN, TaN, Ta/TaN or of W deposited by CVD, PVD or ALD;
deposition of a filling metal 5 (W, Cu, AlCu, AlSi) is carried out, deposited by CVD, ECD or PVD.

A CMP operation is finally carried out for decontacting the pads. As metal is present at the top of the cavities between two pads, short-circuiting is inevitable. The CMP operation makes it possible to remove only the metal from the pads and therefore decontact them.

Figure 4E:
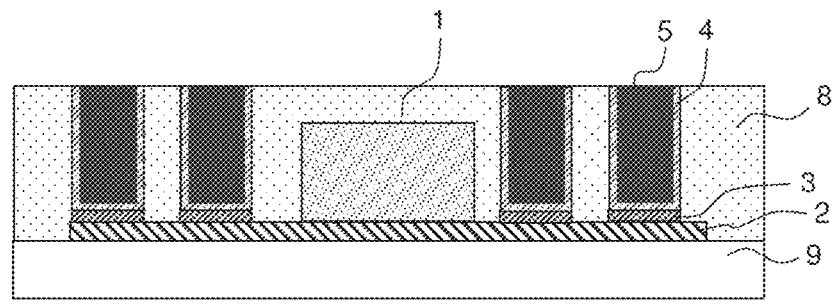

All of these steps are illustrated in FIG. 4*e*.

Sixth Step

This involves an encapsulation step of the assembly defined above with dielectric 8. The thickness D5 of the dielectric above the material 1 may typically be between 200 nm and 1 μm and is preferably between 200 nm and 500 nm. The dielectric(s) used may be: SiN, $SiO_2$, $Al_2O_3$, polymer of the planarizing type (for example BCB, SOG). The deposit may be single-layer or multilayer. They are deposited by PVD, CVD and/or ALD.

The deposition temperature is ≤450° C., preferably ≤300° C.

Figure 4F:
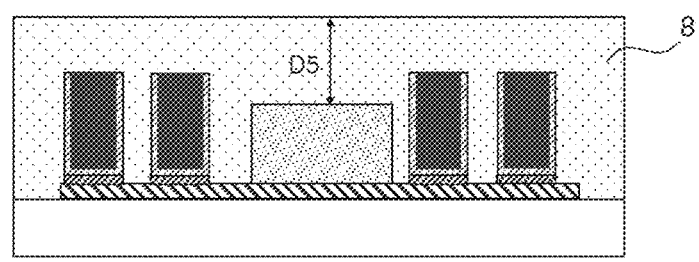

This step is illustrated in FIG. 4*f*.

The operations of phase stabilization or of heat treatment to form one or more intermetallic compounds may be carried out at the end of this step, if they have not already been carried out.

Seventh Step

This involves making second lower apertures $O_{i2}$ intended for the lower contact and apertures $O_s$ intended for the upper contact.

These apertures may be made by dry etching. In this case the presence of an etch stop layer is optional.

Sequential etching may also be employed: a first dry etching used for etching a part of the dielectric stack, stopping on a barrier layer (SiN, $Al_2O_3$, $SiO_2$, BCB, SOC preferably SiN) and then using dry or wet etching for etching the barrier layer and the optional underlying layers, opening onto the material 1.

Said etching operation(s) may be carried out directly via the resin used for photolithography or preferably using a hard mask for example consisting of SiN.

The dimension D2 (width of the upper apertures) may be between 0.5 and 10 μm and is preferably between 1 and 5 μm.

Figure 4G:
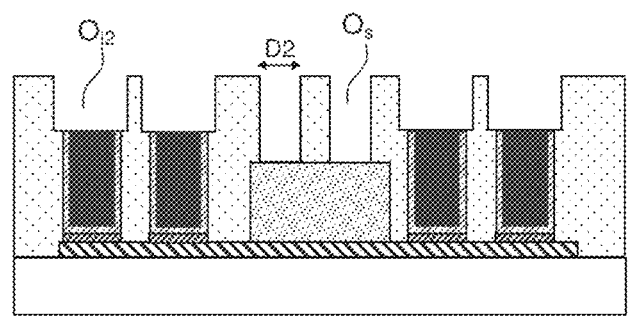

This step is illustrated in FIG. 4*g*.

Eighth Step

This involves depositing metallization compatible with a silicon process flow to define the lower contacts and the upper contact making it possible to avoid the use of noble metals, metals that are not used by the silicon process flow.

Metallization compatible with a silicon process flow may be carried out according to two options:

option 1:
(a) deposition of a metal 3 compatible with a silicon process flow such as $Ni_2P$, $Ni_3P$, NiGe, TiP, TiGe, etc. is carried out;

Phase stabilization may be undertaken by an optional heat treatment carried out after metal deposition;

(b) deposition of a metal 3 compatible with a silicon process flow such as Ni, Ti and alloy such as NiPt, NiTi, NiCo, etc. is carried out;

option 2: deposition of a metal compatible with a silicon process flow (Ni, Ti and their alloys) is carried out; then a heat treatment is carried out with the aim of performing a solid-state reaction between the metal and the III-V material leading to the formation of one or more intermetallic compounds.

The deposition temperatures are preferably ≤450° C.
The annealing temperature is preferably ≤450° C.

According to option 1, the metal or the intermetallic compound is deposited and the work function of the latter is utilized. In this case annealing serves to heal the interface defects and crystallize the metal or the compound.

Figure 4H:
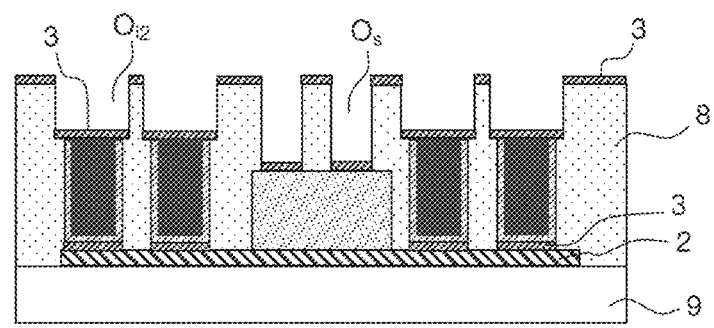

This step is illustrated in FIG. 4*h*.

Ninth Step

This involves filling the lower apertures and the upper apertures and a CMP operation for making connecting pads. Filling of the lower apertures and upper apertures is carried out twice:
deposition of a diffusion barrier/of a keying or nucleation layer 4 is carried out. It may consist of TiN, Ti/TiN, TaN, Ta/TaN or of W deposited by CVD, PVD or ALD;
deposition of a filling metal 5 (W, Cu, AlCu, AlSi) is carried out, deposited by CVD, ECD or PVD.

A CMP operation is finally carried out for decontacting the pads. As the metal is present at the top of the cavities between two pads, short-circuiting is inevitable. The CMP operation makes it possible to remove only the metal from the pads and therefore decontact them.

Figure 4I:
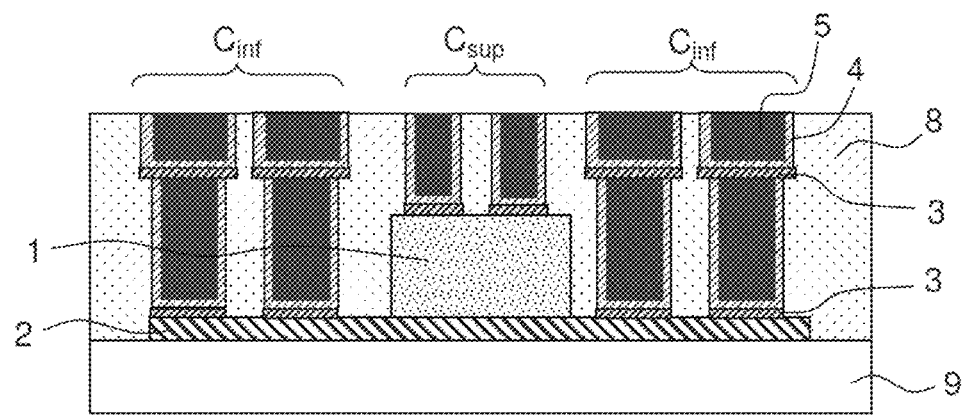

All of these steps are illustrated in FIG. 4i, showing the upper contact $C_{sup}$ and two levels of metallizations 3 in the lower contacts $C_{inf}$.

An alternative to the embodiment described in this first example consists of sequentially defining the cavities of contacts described in FIGS. 4c-4d and then in FIGS. 4g-4h but of defining the pad cavities described in FIGS. 4e and 4i in a single step.

Second Example of a Process According to the Invention Comprising the Production of Upper Contacts Followed by the Production of Lower Contacts According to the First Alternative of the Invention First Step This involves encapsulation of the structure previously produced, comprising a mesa of a first III-V material 1 on the surface of a base of a III-V material 2 on a substrate 9.

The dielectric(s) 8 used may be: SiN, $SiO_2$, $Al_2O_3$, polymer of the planarizing type for example based on benzocyclobutane (BCB), or of the type: SOG "Spin-on-Glass": deposition of amorphous dielectric by centrifugation.

The deposit may be single-layer or multilayer.

The dielectrics are deposited by PVD (physical vapor deposition), CVD (chemical vapor deposition) and/or ALD (atomic layer deposition). The deposition temperature may typically be ≤550° C., preferably ≤450° C.

The stress of the layers produced may advantageously be ≤200 MPa, preferably ≤100 MPa.

Figure 5A:
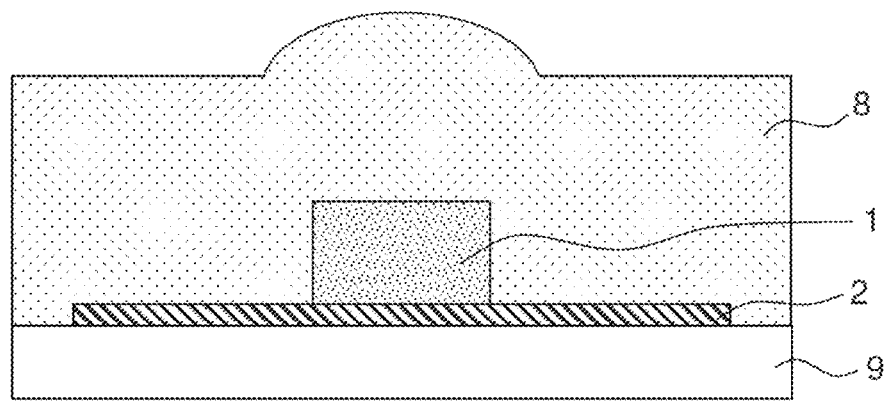
FIGS. 5a to 5h illustrate the various steps of a second example of the process of the invention according to the first alternative and comprising production of the upper contacts and then the lower contacts made on individual contact bottom metallizations.

This encapsulation step is illustrated in FIG. 5a.

Second Step

This involves planarization of the dielectric by a CMP operation ("chemical mechanical planarization" or "chemical mechanical polishing") or partial removal by dry etching ("etch back") in the case of a planarizing polymer.

There are certain polymers that have the property of being self-leveling. That is, they will fill the lower parts first, before the upper parts. However, to ensure that the cavities are filled completely, the deposit is thicker than the depth of the cavity. It is then necessary to reduce the thickness of the surplus deposit. This can be done by dry etching on the whole wafer, called "etch back".

It is also possible to use an operation of localized lithography/etching on the topography before CMP.

Figure 5B:
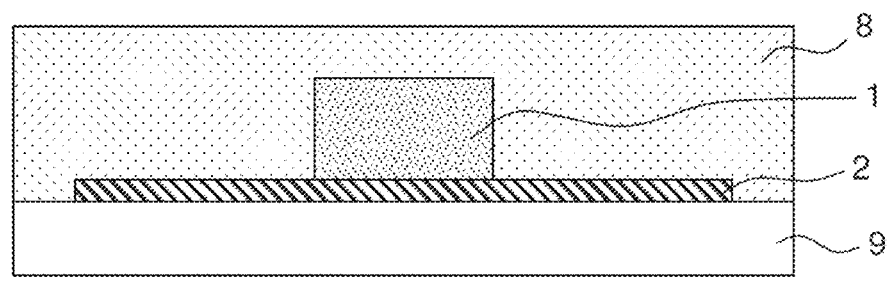

This planarization step is illustrated in FIG. 5b.

Third Step

This involves making upper apertures $O_s$ intended for the upper contact.

These apertures may be made by dry etching. In this case the presence of an etch stop layer is optional.

Sequential etching may also be employed:
a first dry etching used for etching a part of the dielectric stack, stopping on a barrier layer (SiN, $Al_2O_3$, $SiO_2$, BCB, SOC preferably SiN) and then using dry or wet etching for etching the barrier layer and the optional underlying layers, opening onto the material 1.

Said etching operation(s) may be carried out directly via the resin used for photolithography or preferably using a hard mask for example consisting of SiN.

Figure 5C:
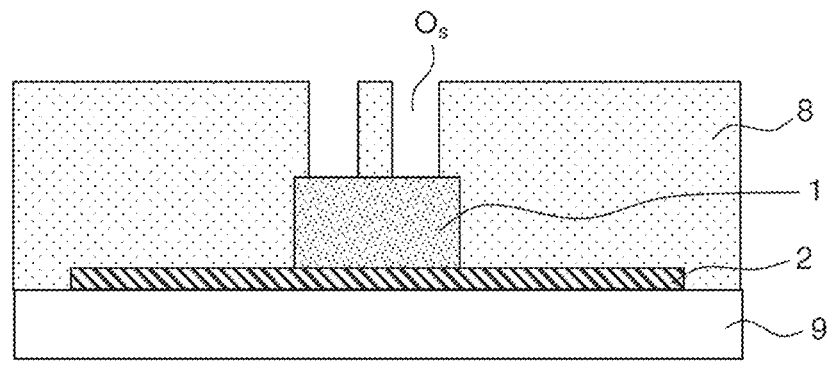

This step of making apertures is illustrated in FIG. 5c.

Fourth Step

This involves depositing metallization compatible with a silicon process flow to define the upper contact making it possible to avoid the use of noble metals, metals that are not used by the silicon process flow.

Metallization compatible with a silicon process flow may be carried out according to two options:
option 1:
(a) deposition of a metal 3 compatible with a silicon process flow such as $Ni_2P$, $Ni_3P$, NiGe, TiP, TiGe, etc. is carried out;
Phase stabilization may be undertaken by an optional heat treatment carried out after metal deposition;
(b) deposition of a metal 3 compatible with a silicon process flow such as Ni, Ti and alloy such as NiPt, NiTi, NiCo, etc. is carried out;
option 2: deposition of a metal compatible with a silicon process flow (Ni, Ti and their alloys) is carried out; then a heat treatment is carried out with the aim of performing a solid-state reaction between the metal and the III-V material leading to the formation of one or more intermetallic compounds.

The deposition temperatures are preferably ≤450° C.

The annealing temperature is preferably ≤450° C.

According to option 1, the metal or the intermetallic compound is deposited and the work function of the latter is utilized. In this case annealing serves to heal the interface defects and crystallize the metal or the compound.

Figure 5D:
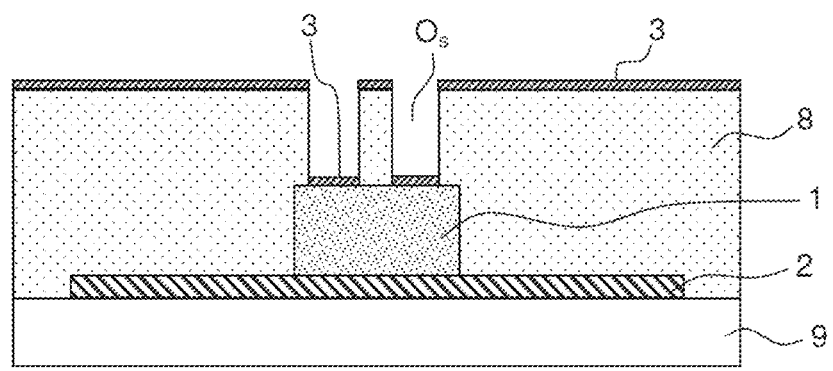

This step is illustrated in FIG. 5d.

Fifth Step

This involves filling the upper apertures, and a CMP operation for making connecting pads. Filling of the upper apertures is carried out twice:
deposition of a diffusion barrier/of a keying or nucleation layer 4 is carried out. It may consist of TiN, Ti/TiN, TaN, Ta/TaN or of W deposited by CVD, PVD or ALD;
deposition of a filling metal 5 (W, Cu, AlCu, AlSi) is carried out, deposited by CVD, ECD or PVD.

A CMP operation is finally carried out for decontacting the pads. As metal is present at the top of the cavities between two pads, short-circuiting is inevitable. The CMP operation makes it possible to remove only the metal from the pads and therefore decontact them.

Figure 5E:
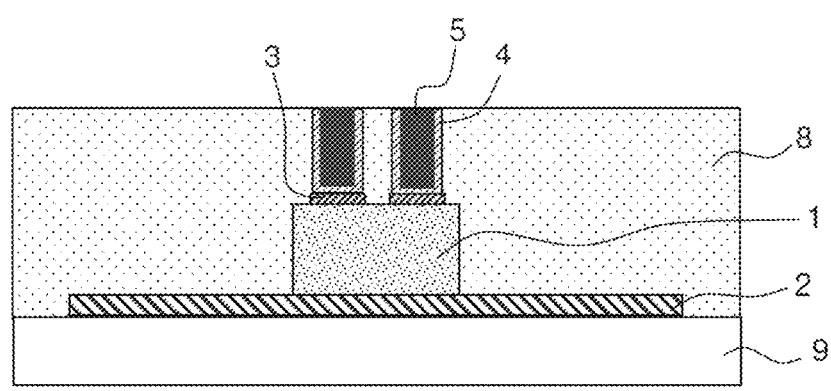

All of these steps are illustrated in FIG. 5e, showing two levels of metallizations 3 in the upper contacts.

Sixth Step

This involves making lower apertures $O_i$ intended for the lower contacts.

These apertures may be made by dry etching. In this case the presence of an etch stop layer is optional.

Sequential etching may also be employed:
a first dry etching used for etching a part of the dielectric stack, stopping on a barrier layer (SiN, $Al_2O_3$, $SiO_2$, BCB, SOC preferably SiN) and then using dry or wet etching for etching the barrier layer and the optional underlying layers, opening onto the material 2.

Said etching operation(s) may be carried out directly via the resin used for photolithography or preferably using a hard mask for example consisting of SiN.

Figure 5F:
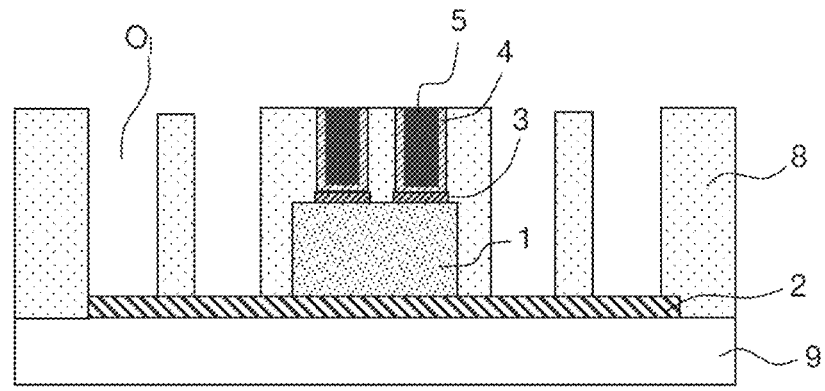

This step of making apertures is illustrated in FIG. 5f.

Seventh Step

This involves depositing metallization compatible with a silicon process flow to define the lower contacts, making it possible to avoid the use of noble metals, metals that are not used by the silicon process flow.

Metallization compatible with a silicon process flow may be carried out according to two options:
option 1:
  (a) deposition of a metal 3 compatible with a silicon process flow such as $Ni_2P$, $Ni_3P$, NiGe, TiP, TiGe, etc. is carried out;
  Phase stabilization may be undertaken by an optional heat treatment carried out after metal deposition;
  (b) deposition of a metal 3 compatible with a silicon process flow such as Ni, Ti and alloy such as NiPt, NiTi, NiCo, etc. is carried out;
option 2: deposition of a metal compatible with a silicon process flow (Ni, Ti and their alloys) is carried out; then a heat treatment is carried out with the aim of performing a solid-state reaction between the metal and the III-V material leading to the formation of one or more intermetallic compounds.

The deposition temperatures are preferably ≤450° C.
The annealing temperature is preferably ≤450° C.

According to option 1, the metal or the intermetallic compound is deposited and the work function of the latter is utilized. In this case annealing serves to heal the interface defects and crystallize the metal or the compound.

Figure 5G:
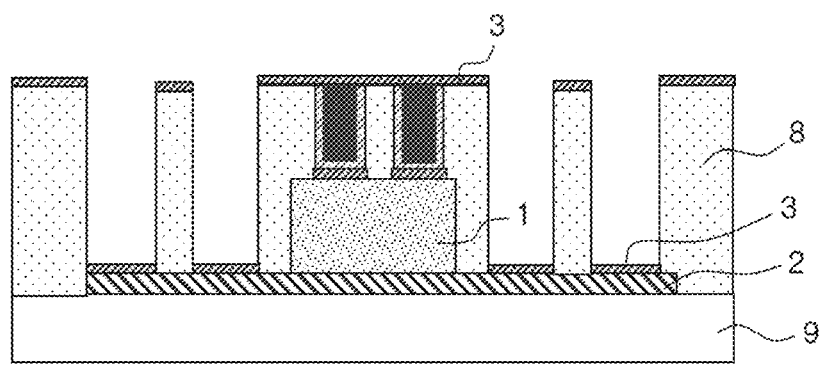

This step is illustrated in FIG. 5g.

Eighth Step

This involves filling the lower apertures, and a CMP operation for making connecting pads. The lower apertures are filled twice:
  deposition of a diffusion barrier/of a keying or nucleation layer 4 is carried out. It may consist of TiN, Ti/TiN, TaN, Ta/TaN or of W deposited by CVD, PVD or ALD;
  deposition of a filling metal 5 (W, Cu, AlCu, AlSi) is carried out, deposited by CVD, ECD or PVD.

A CMP operation is finally carried out for decontacting the pads. As metal is present at the top of the cavities between two pads, short-circuiting is inevitable. The CMP operation makes it possible to remove only the metal from the pads and therefore decontact them.

Figure 5H:
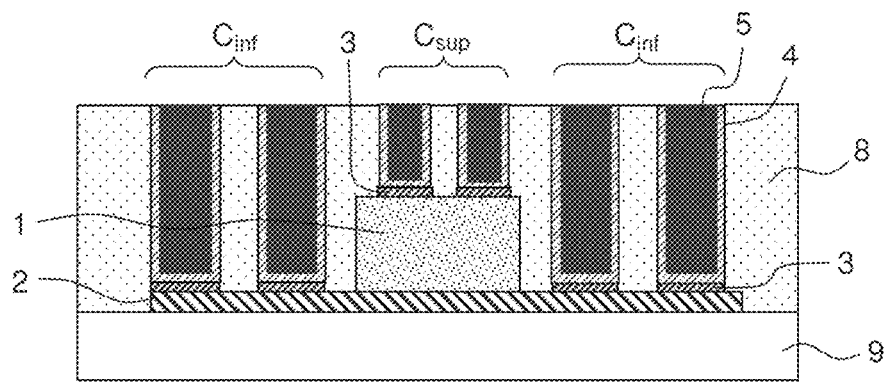

All of these operations are illustrated in FIG. 5h, showing two levels of metallizations 3 in the lower contacts.

An alternative to the embodiment described in this second example consists of sequentially opening the cavities of contacts described in FIGS. 5c-5d and then in FIGS. 5f-5g but opening the pad cavities described in FIGS. 5e and 5h in a single step.

Third Example of a Process According to the Invention Comprising the Simultaneous Production of Upper Contacts and of Lower Contacts According to the First Alternative of the Invention

First Step

This involves encapsulation of the structure previously produced that comprises a mesa of a first III-V material 1 on the surface of a base of a III-V material 2 on a substrate 9.

The dielectric(s) 8 used may be: SiN, $SiO_2$, $Al_2O_3$, polymer of the planarizing type for example based on benzocyclobutane (BCB), or of the type: SOG "Spin-on-Glass": deposition of amorphous dielectric by centrifugation.

The deposit may be single-layer or multilayer.

The dielectrics are deposited by PVD (physical vapor deposition), CVD (chemical vapor deposition) and/or ALD (atomic layer deposition). The deposition temperature may typically be ≤550° C., preferably ≤450° C.

The stress of the layers produced may advantageously be ≤200 MPa, preferably ≤100 MPa.

Figure 6A:
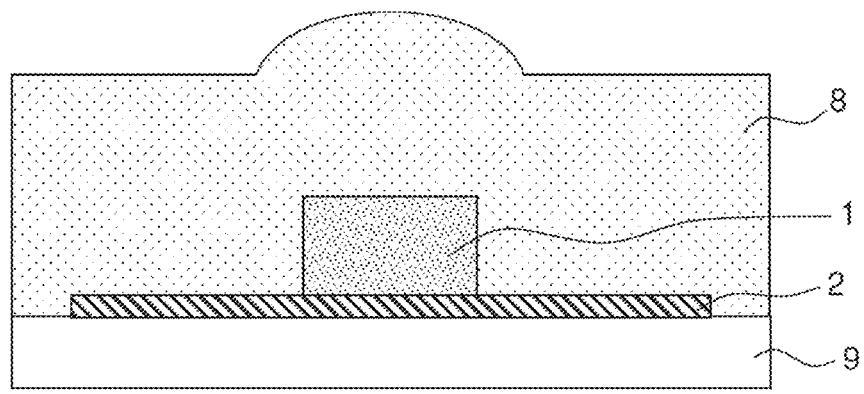
FIGS. 6a to 6e illustrate the various steps of a third example of the process of the invention according to the first alternative and comprising production of the lower contacts simultaneously with the upper contacts made on individual contact bottom metallizations.

This encapsulation step is illustrated in FIG. 6a.

Second Step

This involves planarization of the dielectric by a CMP operation ("chemical mechanical planarization" or "chemical mechanical polishing") or partial removal by dry etching ("etch back") in the case of a planarizing polymer.

There are certain polymers that have the property of being self-leveling. That is, they will fill the lower parts first, before the upper parts. However, to ensure that the cavities are filled completely, the deposit is thicker than the depth of the cavity. It is then necessary to reduce the thickness of the surplus deposit. This can be done by dry etching on the whole wafer, called "etch back".

It is also possible to use an operation of localized lithography/etching on the topography before CMP.

Figure 6B:
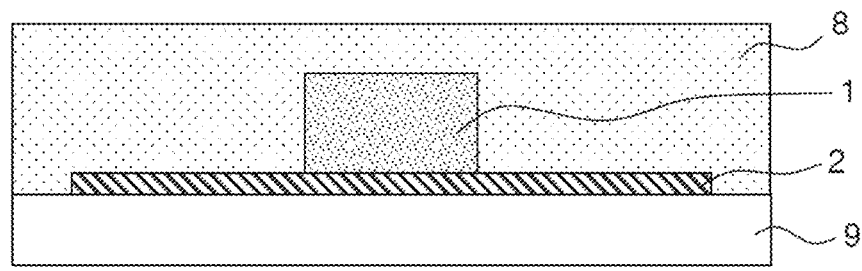

This planarization step is illustrated in FIG. 6b.

Third Step

This involves making upper apertures $O_s$ intended for the upper contact and lower apertures $O_i$ intended for the lower contacts.

These apertures may be made by dry etching. In this case the presence of an etch stop layer is optional.

Sequential etching may also be employed:
  a first dry etching used for etching a part of the dielectric stack, stopping on a barrier layer (SiN, $Al_2O_3$, $SiO_2$, BCB, SOC preferably SiN) and then using dry or wet etching for etching the barrier layer and the optional underlying layers, opening onto the material 1 and onto the material 2.

Said etching operation(s) may be carried out directly via the resin used for photolithography or preferably using a hard mask for example consisting of SiN.

Figure 6C:
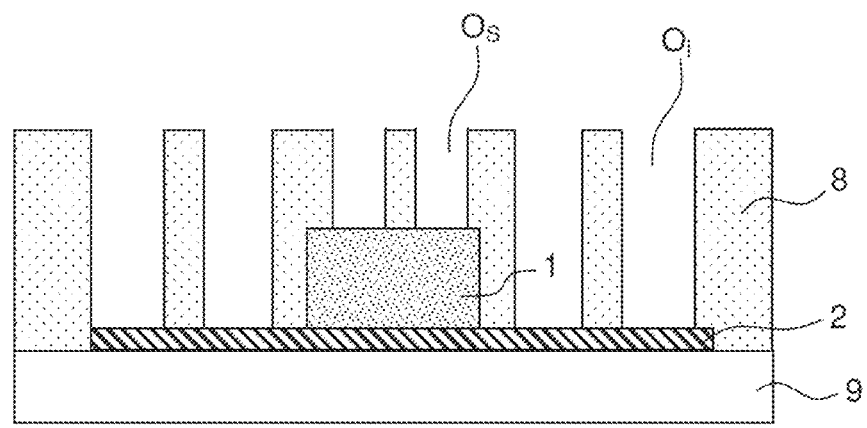

This step of making apertures is illustrated in FIG. 6c.

Fourth Step

This involves depositing metallization compatible with a silicon process flow to define the upper contacts and the lower contacts, making it possible to avoid the use of noble metals, metals that are not used by the silicon process flow.

Metallization compatible with a silicon process flow may be carried out according to two options:
option 1:
  (a) deposition of a metal 3 compatible with a silicon process flow such as $Ni_2P$, $Ni_3P$, NiGe, TiP, TiGe, etc. is carried out;
  Phase stabilization may be undertaken by an optional heat treatment carried out after metal deposition;
  (b) deposition of a metal 3 compatible with a silicon process flow such as Ni, Ti and alloy such as NiPt, NiTi, NiCo, etc. is carried out;

option 2: deposition of a metal compatible with a silicon process flow (Ni, Ti and their alloys) is carried out; then a heat treatment is carried out with the aim of performing a solid-state reaction between the metal and the III-V material leading to the formation of one or more intermetallic compounds.

The deposition temperatures are preferably ≤450° C.

The annealing temperature is preferably ≤450° C.

According to option 1, the metal or the intermetallic compound is deposited and the work function of the latter is utilized. In this case annealing serves to heal the interface defects and crystallize the metal or the compound.

Figure 6D:
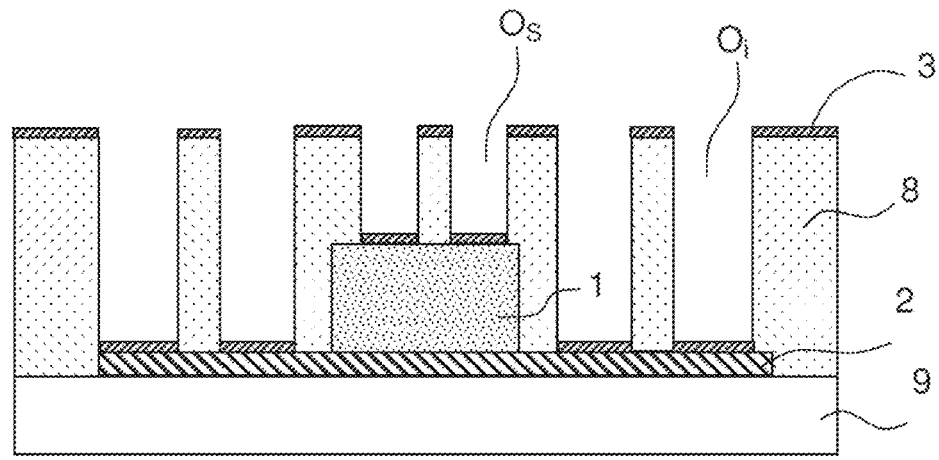

This step is illustrated in FIG. 6d.

Fifth Step

This involves filling the upper apertures and lower apertures, and a CMP operation for making connecting pads. Simultaneous filling of the upper and lower apertures is carried out twice:
  deposition of a diffusion barrier/of a keying or nucleation layer 4 is carried out. It may consist of TiN, Ti/TiN, TaN, Ta/TaN or of W deposited by CVD, PVD or ALD;
  deposition of a filling metal 5 (W, Cu, AlCu, AlSi) is carried out, deposited by CVD, ECD or PVD.

A CMP operation is finally carried out for decontacting the pads. As metal is present at the top of the cavities between two pads, short-circuiting is inevitable. The CMP operation makes it possible to remove only the metal from the pads and therefore decontact them.

Figure 6E:
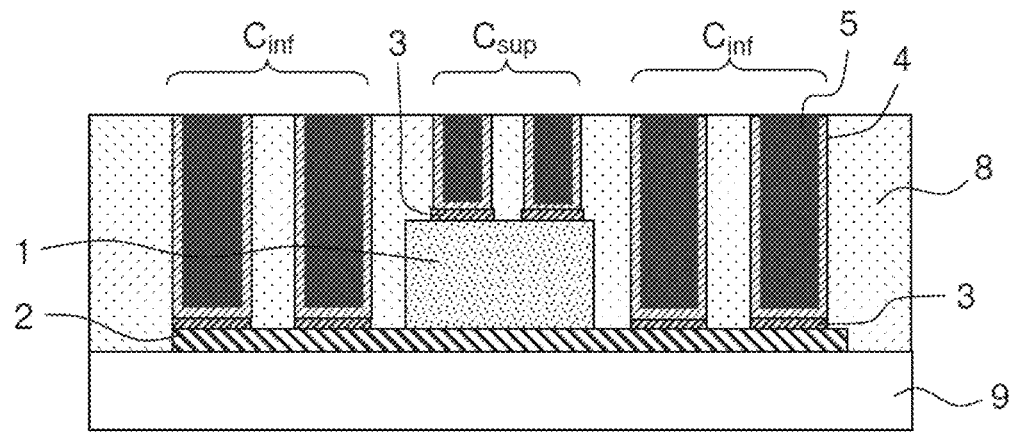

This step is illustrated in FIG. 6e.

A variant of the first example of a process according to the invention comprising the production of lower contacts followed by the production of an upper contact according to the first alternative of the invention, consists of adding a step of lithography in order to remove the metallization layer 3 present in the low level pads (external). The latter adds interfaces and might therefore be harmful from an electrical standpoint.

This variant is described below and comprises steps in common with those described in FIGS. 4a to 4f and is illustrated in FIGS. 7f to 7i, the reference letters being kept the same for better understanding.

Figure 7F:
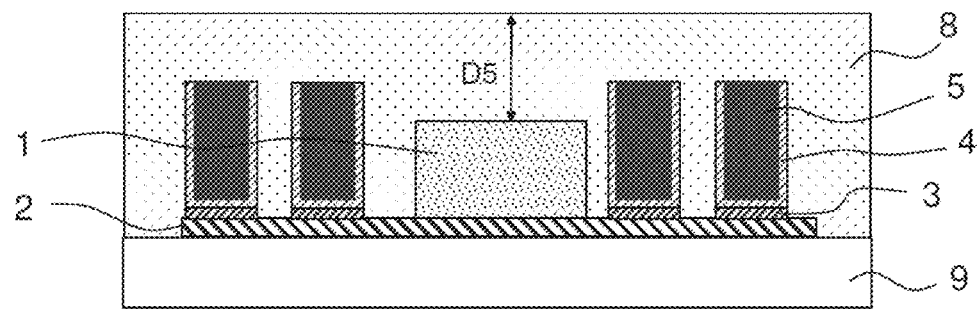
FIGS. 7f to 7k illustrate variants of steps for producing the lower contact pads illustrated in FIGS. 4a to 4i making it unnecessary to have a metallic interface layer in said lower contact pads.

An assembly is produced, in which pads of lower contacts were made beforehand, encapsulated in dielectric 8 as illustrated in FIG. 7f.

Figure 7G:
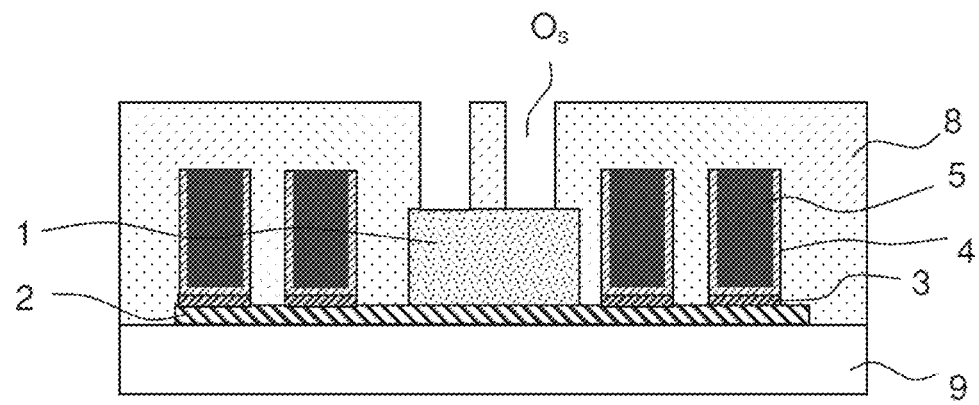

Then apertures $O_s$ are made at the level of the first material 1, intended for the upper contact as illustrated in FIG. 7g. These apertures may be made by dry etching. In this case the presence of an etch stop layer is optional.

Sequential etching may also be carried out:
  a first dry etching used for etching a part of the dielectric stack, stopping on a barrier layer (SiN, $Al_2O_3$, $SiO_2$, BCB, SOC preferably SiN) and then using dry or wet etching for etching the barrier layer and the optional underlying layers, opening onto the material 1.

Said etching operation(s) may be carried out directly via the resin used for photolithography or preferably using a hard mask for example consisting of SiN.

Then metallization compatible with a silicon process flow is deposited, to define the upper contacts and the lower contacts, making it possible to avoid the use of noble metals, metals that are not used by the silicon process flow.

Metallization compatible with a silicon process flow may be carried out according to two options:
  option 1:
    (a) deposition of a metal 3 compatible with a silicon process flow such as $Ni_2P$, $Ni_3P$, NiGe, TiP, TiGe, etc. is carried out;
    Phase stabilization may be undertaken by an optional heat treatment carried out after metal deposition;
    (b) deposition of a metal 3 compatible with a silicon process flow such as Ni, Ti and alloy such as NiPt, NiTi, NiCo, etc. is carried out;
  option 2: deposition of a metal compatible with a silicon process flow (Ni, Ti and their alloys) is carried out; then a heat treatment is carried out with the aim of performing a solid-state reaction between the metal and the III-V material leading to the formation of one or more intermetallic compounds.

The deposition temperatures are preferably ≤450° C.

The annealing temperature is preferably ≤450° C.

According to option 1, the metal or the intermetallic compound is deposited and the work function of the latter is utilized. In this case annealing serves to heal the interface defects and crystallize the metal or the compound.

Figure 7H:
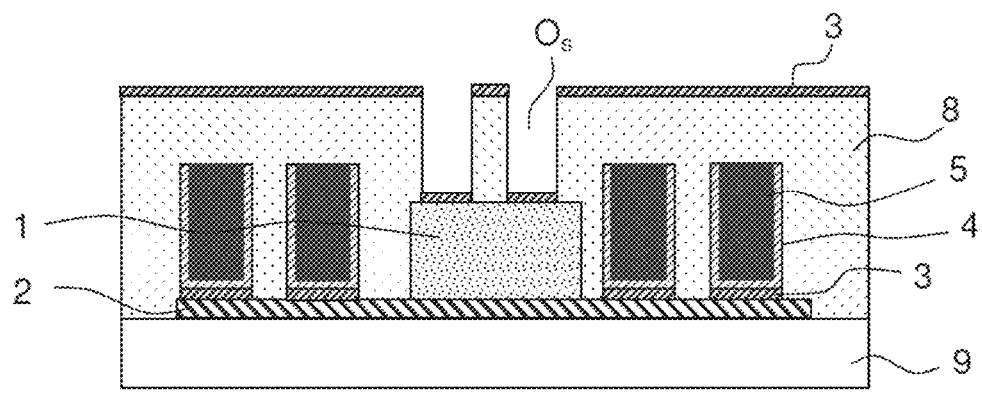

This step is illustrated in FIG. 7h.

Figure 7I:
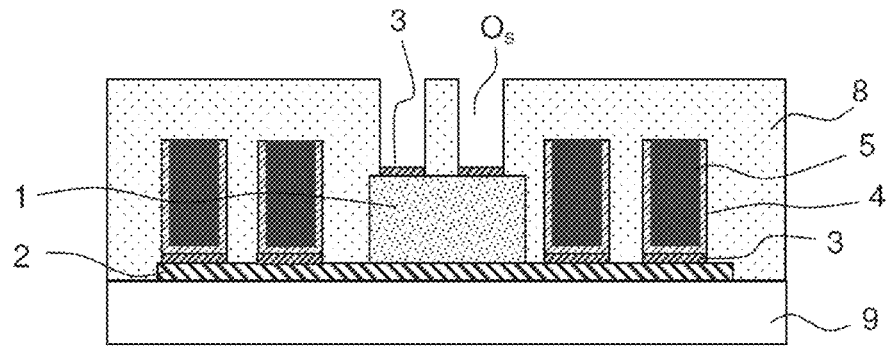

An operation of the CMP type is then undertaken for removing the excess metal at the top of the dielectric stack, as illustrated in FIG. 7i, only leaving the layer 3 present at the level of the apertures $O_s$.

Figure 7J:
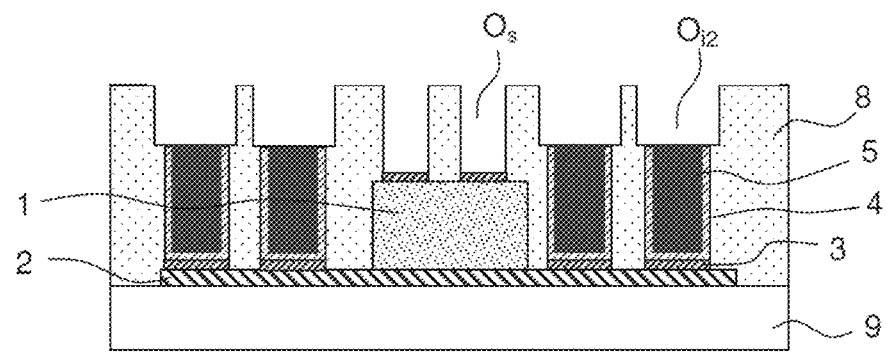

Then second lower apertures $O_{i2}$ intended for the lower contacts are made, as illustrated in FIG. 7j. These apertures may be made by dry etching. In this case the presence of an etch stop layer is optional.

Sequential etching may also be used:
Dielectric stack etching for opening out the external pads of lower contacts on the material:
  Etching carried out once up to the filler material of the low level pads: dry etching. In this case the presence of an etch stop layer is optional.
  Sequential etching: a first dry etching used for etching a part of the dielectric stack, stopping on a barrier layer (SiN, $Al_2O_3$, $SiO_2$, BCB, SOC preferably SiN) and then using dry or wet etching for etching the barrier layer and the optional underlying layers, opening onto the filler material of the low level pads.

Said etching operation(s) may be carried out directly via the resin used for photolithography or preferably using a hard mask for example consisting of SiN.

Then the upper pads and the upper part of the lower pads are produced, on top of the first part of the lower pads made previously. This operation is carried out by filling all of the apertures $O_s$ and $O_{i2}$.

Simultaneous filling of the upper apertures $O_s$ and lower apertures $O_{i2}$ is carried out twice:
  deposition of a diffusion barrier/of a keying or nucleation layer 4 is carried out. It may consist of TiN, Ti/TiN, TaN, Ta/TaN or of W deposited by CVD, PVD or ALD;
  deposition of a filling metal 5 (W, Cu, AlCu, AlSi) is carried out, deposited by CVD, ECD or PVD.

A CMP operation is finally carried out for decontacting the pads. As metal is present at the top of the cavities between two pads, short-circuiting is inevitable. The CMP operation makes it possible to remove only the metal from the pads and therefore decontact them.

Figure 7K:
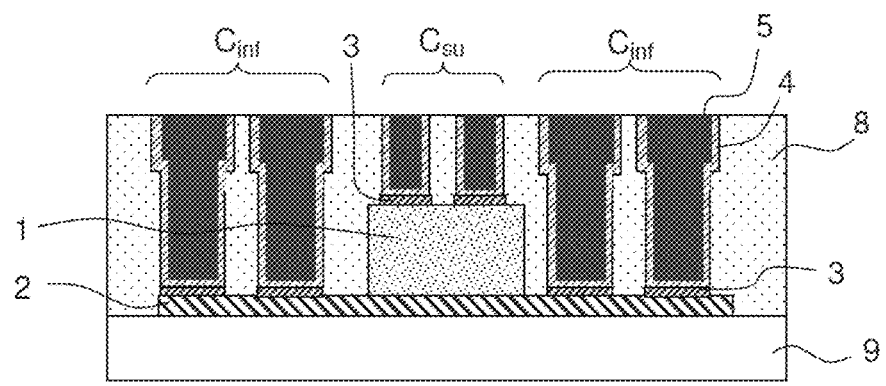

This filling operation is illustrated in FIG. 7k.

An alternative to the apertures of pads described in the three examples described above consists of integrating the contact pads by a dual-damascene process. Dual damascene is a two-step etching process in which metallic filling and then CMP for removing excess metal (barrier of one or two layers+filling) are carried out successively in a single step. This generally makes it possible to produce a via and a line that leads to this via: connection and routing.

Figure 8B:
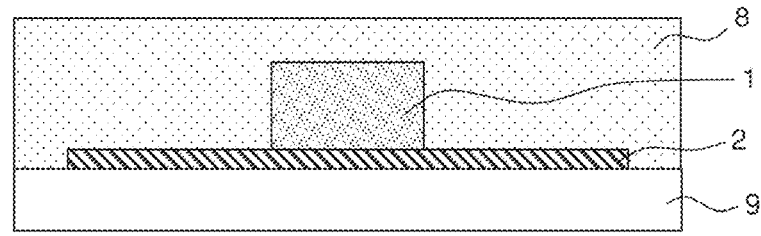
FIGS. 8b to 8e illustrate process steps constituting a variant of the steps for making the contact pads by a dual-damascene process.

This alternative is shown schematically according to the embodiment illustrated in FIGS. 8b to 8e. An encapsulated and smoothed assembly such as that illustrated in FIG. 8b is produced in a manner similar to those described above.

The top part of the lower apertures called second lower apertures $O_{i2}$ is made by partial etching of the dielectric. Dry etching may be used. In this case the presence of an etch stop layer is optional.

Said etching operation(s) may be carried out directly via the resin used for photolithography or using a hard mask consisting for example of SiN.

Figure 8C:
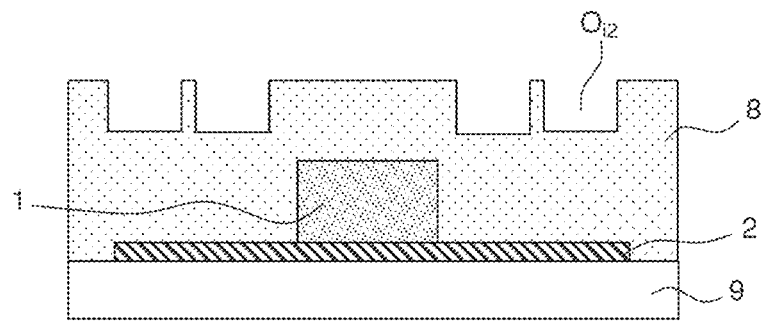

This step is illustrated in FIG. 8c.

A second operation of etching the dielectric is carried out for making upper apertures $O_s$ and the lower part of the lower apertures called first lower apertures $O_{i1}$.

These apertures may be made by dry etching. In this case the presence of an etch stop layer is optional.

Sequential etching may also be used:
Dielectric stack etching for opening the external pads of lower contacts out onto the material:
  Etching carried out once up to the filler material of the low level pads: dry etching. In this case the presence of an etch stop layer is optional.
  Sequential etching: a first dry etching used for etching a part of the dielectric stack, stopping on a barrier layer (SiN, $Al_2O_3$, $SiO_2$, BCB, SOC preferably SiN) and then using dry or wet etching for etching the barrier layer and the optional underlying layers, opening onto the filler material of the low level pads.

Said etching operation(s) may be carried out directly via the resin used for photolithography or preferably using a hard mask for example consisting of SiN.

Figure 8D:
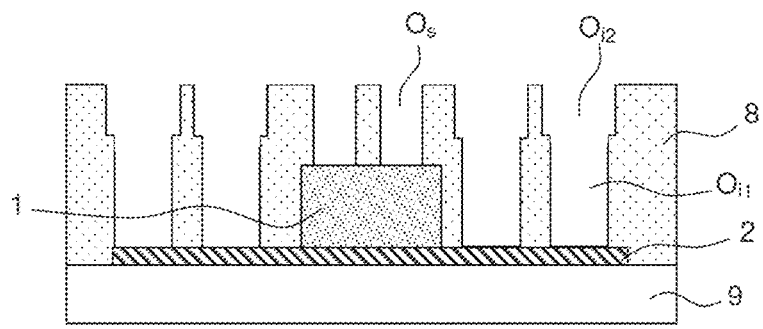

This step is illustrated in FIG. 8d.

The pads of the lower and upper contacts are then produced by filling. Simultaneous filling of the upper apertures $O_s$ and lower apertures $O_{i2}$ and $O_{i2}$ is carried out twice:
  deposition of a diffusion barrier/of a keying or nucleation layer 4 is carried out. It may consist of TiN, Ti/TiN, TaN, Ta/TaN or of W deposited by CVD, PVD or ALD;
  deposition of a filling metal 5 (W, Cu, AlCu, AlSi) is carried out, deposited by CVD, ECD or PVD.

A CMP operation is finally carried out for decontacting the pads. As metal is present at the top of the cavities between two pads, short-circuiting is inevitable. The CMP operation makes it possible to remove only the metal from the pads and therefore decontact them.

Figure 8E:
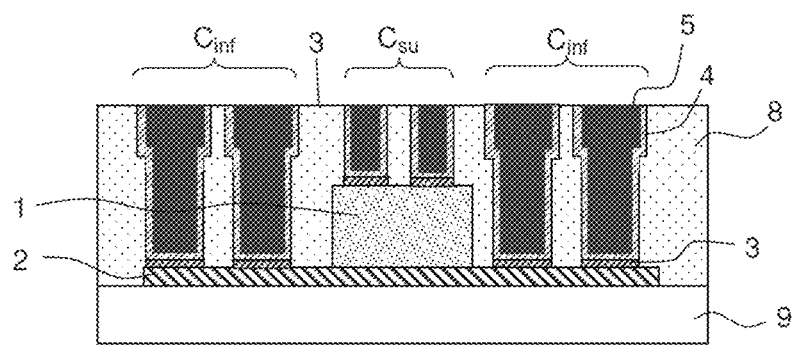

This filling operation is illustrated in FIG. 8e.

All the embodiments described in the preceding examples may be supplemented with an additional level of integration.

Figure 9:
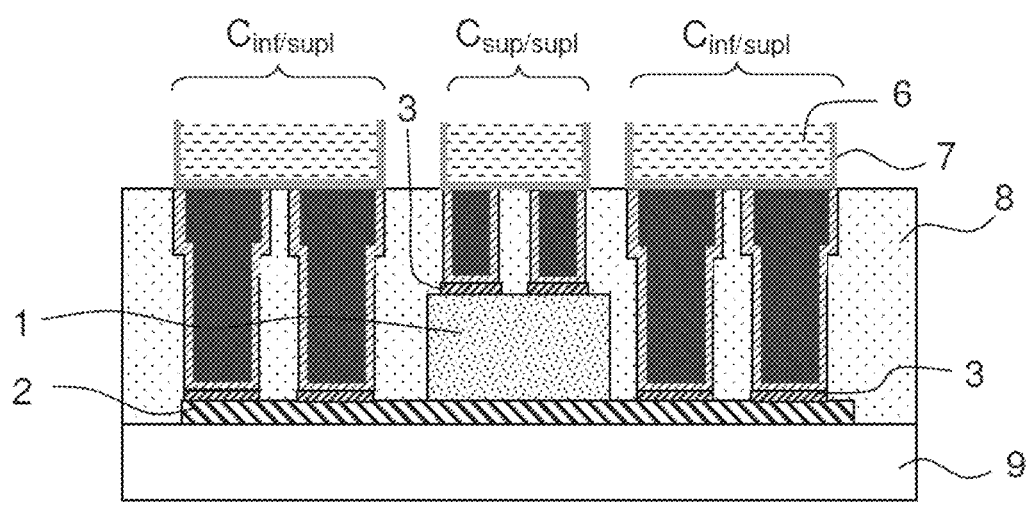
FIG. 9 illustrates a step of integration of an additional contact level that may be employed in variants of the process of the invention.

An additional step may thus be carried out by performing an additional deposition of dielectric 8, then making additional upper and lower apertures by etching and filling these apertures to define the contacts $C_{inf/supl}$ and $C_{sup/supl}$ as illustrated in FIG. 9.

For this, in the additional upper and lower apertures, a barrier 7 is deposited, which may be of TiN, Ti/TiN, TaN, Ta/TaN, W and filling with a metal 6 that may be W, Cu or Al, AlCu, AlSi.

Example of a Laser Component Produced by the Process of the Invention

The process of the present invention advantageously makes it possible to produce a laser based on III-V materials:

A substrate 90 of $SiO_2$ comprises a silicon guide 91, on top of which the following are produced:
  a base of second III-V material 2, which may be of n-doped InP, and a mesa 1 comprising a multiple quantum well structure that may be made of InGaAsP with different dopings and a layer of p-doped InGaAs, the nature of the III-V materials determining the emission wavelength;
  the dielectric 8 may be of SiN, $SiO_2$, or of polymer of the planarizing type for example based on BCB;
  contact bottom metallization 3 may be for example of Ni, Ti, or alloys thereof ($Ni_2P$, $Ni_3P$, NiGe, TiP, TiGe, etc.);
  the diffusion barrier to F and/or the keying layer to W 4 may be of TiN, Ti/TiN, TaN, Ta/TaN, W,
  The filling metal 5 may be of Cu or Al, AlCu, AlSi.

Figure 10:
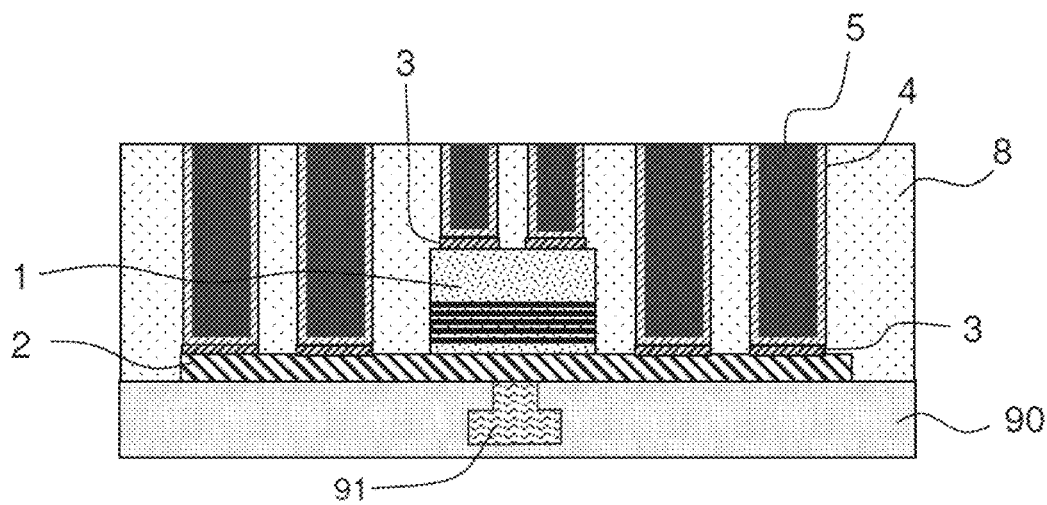
FIG. 10 illustrates a first example of a laser component produced by the process of the invention.

This example of a laser is illustrated in FIG. 10.

Example of a Vertically Emitting Laser Component of the VCSEL Type

It is recalled that in general, a vertical-cavity surface-emitting laser diode, or VCSEL, is a type of semiconductor laser diode emitting a laser beam perpendicularly to the surface, in contrast to the conventional edge-emitting semiconductor lasers.

This example of a laser mainly comprises the same type of structure as that described in the preceding example.

However, to allow emission of laser radiation at the top of the structure, the upper contact is made circular.

This example of component comprises a silicon substrate 9, on top of which the following are produced: a base of second III-V material 2, which may be of n-doped InP, and a mesa 1 comprising a multiple quantum well structure that may be based on InGaAsP, AlGaAs, GaAs, InGaAsN and a layer of p-doped InGaAs, the nature of the III-V materials determining the emission wavelength.

The dielectric 8 may be of SiN, $SiO_2$, or of polymer of the planarizing type for example based on BCB.

The contact bottom metallization 3 may be for example of Ni, Ti, or alloys thereof ($Ni_2P$, $Ni_3P$, NiGe, TiP, TiGe, etc.).

The diffusion barrier to F and/or the keying layer to W 4 may be of TiN, Ti/TiN, TaN, Ta/TaN, W.

The filling metal 5 may be of Cu or Al, AlCu, AlSi.

The metallizations 3 and the elements 4 and 5 constitute the contacts $C_{sup}$ and $C_{inf}$.

Owing to the circular upper contact $C_{sup}$, the laser beam may be extracted from the upper surface of the component.

Figure 11:
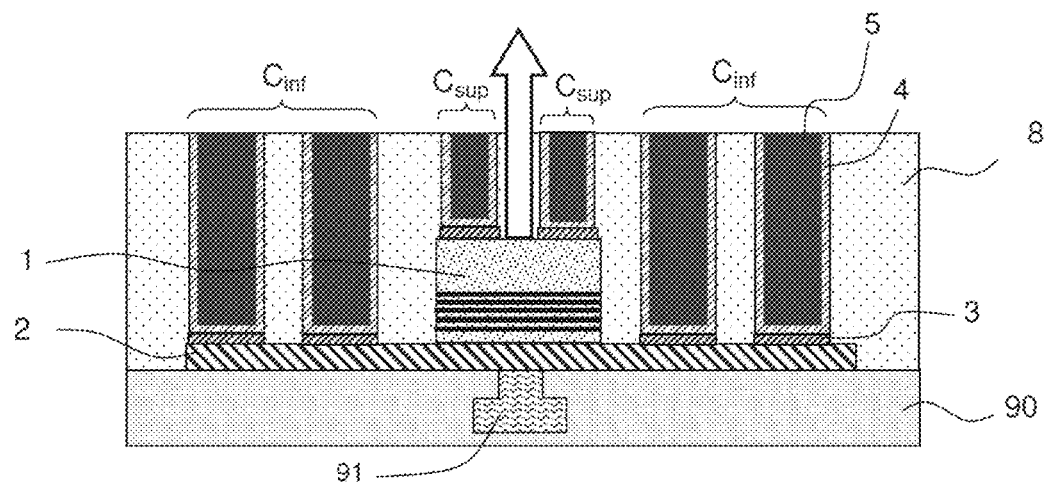
FIG. 11 illustrates a second example of a laser component produced by the process of the invention.

This example of a laser is illustrated in FIG. 11.

II) Second Alternative of the Invention Comprising Making Primary Apertures and Secondary Apertures According to this second alternative described above, a primary aperture bottom metallization and a contact pad in a secondary aperture are defined. The contact thus consists of at least the aperture bottom metallization and the contact pad in contact with said metallization.

Figure 12:
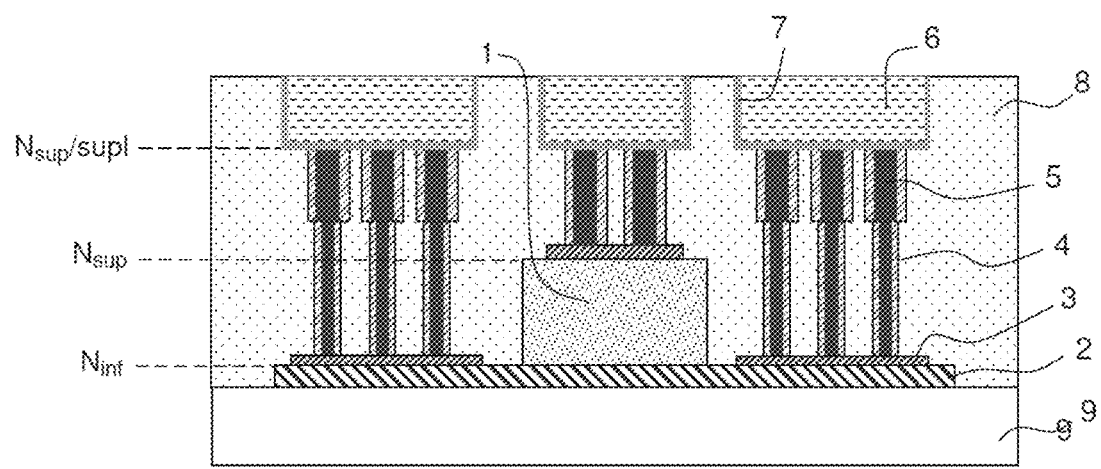
FIG. 12 illustrates a first example of a component made in the context of the second alternative of the present invention and comprising contact bottom metallizations shared among several pads.

FIG. 12 shows an example of a component obtained by a process belonging to the first alternative of the invention and showing, on a substrate 9, the III-V materials 1 and 2, metallizations 3 serving as contact bottom metallizations, on which contact pads are produced comprising diffusion barriers 4; the secondary apertures are filled with filling metal 5. The whole is encapsulated in a dielectric 8. FIG. 12 shows the contact levels: a lower level $N_{inf}$, an upper level $N_{sup}$. According to this example, an additional level $N_{sup/supl}$ may be envisaged, on which contact pads may be made, filled with diffusion barrier 7 and filling metal 6.

The first III-V material may consist of III-V material such as InP, $In_{1-x}Ga_xAs$ (with $0 \leq x \leq 1$), GaAs, InAs, GaSb, $In_{1-x}Ga_xSb$, $In_xGa_{1-x}As_{1-y}P_y$, $In_xGa_{1-x}As_{1-y}N_y$, $B_xIn_yGa_{1-x-y}As$.

The second III-V material may also consist of III-V material such as InP, $In_{1-x}Ga_xAs$ (with $0 \leq x \leq 1$), GaAs, InAs, GaSb, $In_{1-x}Ga_xSb$, $In_xGa_{1-x}As_{1-y}P_y$, $Ga_{1-x}In_xP$, $In_xGa_{1-x}As_{1-y}N_y$, $B_xIn_yGa_{1-x-y}A$. It may be identical to or different from the first material.

The substrate may be a silicon substrate, which may for example have a thickness of the order of some hundreds of millimeters (for example 200 mm).

First Example of a Process According to the Invention Comprising the Production of Lower Contacts Followed by the Production of an Upper Contact According to the Second Alternative of the Invention First Step This involves encapsulation of the structure previously produced, which comprises a mesa of a first III-V material 1 on the surface of a base of a III-V material 2 on a substrate 9.

The dielectric(s) 8 used may be: SiN, $SiO_2$, $Al_2O_3$, polymer of the planarizing type for example based on benzocyclobutane (BCB), or of the type: SOG "Spin-on-Glass": deposition of amorphous dielectric by centrifugation.

The deposit may be single-layer or multilayer.

The dielectrics are deposited by PVD (physical vapor deposition), CVD (chemical vapor deposition) and/or ALD (atomic layer deposition). The deposition temperature may typically be $\leq 550°$ C., preferably $\leq 450°$ C.

The stress of the layers produced may advantageously be $\leq 200$ MPa, preferably $\leq 100$ MPa.

Figure 13A:
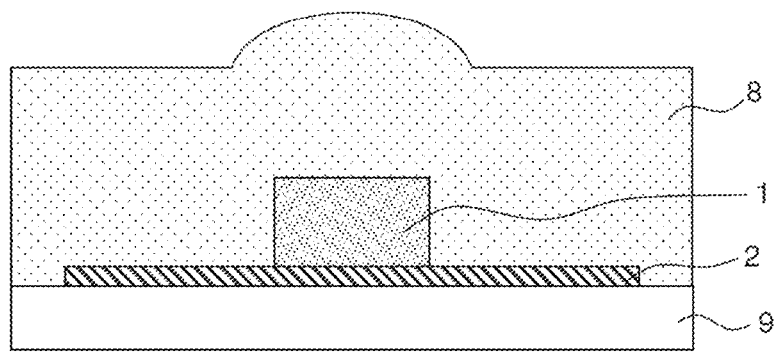
FIGS. 13a to 13o illustrate the various steps of a first example of a process carried out in the context of the second alternative of the invention comprising production of the lower contacts and then the upper contacts and comprising secondary upper apertures and secondary lower apertures.

This encapsulation step is illustrated in FIG. 13a.

Second Step

This involves planarization of the dielectric by a CMP operation (for "chemical mechanical planarization" or "chemical mechanical polishing") or partial removal by dry etching ("etch back") in the case of a planarizing polymer.

There are certain polymers that have the property of being self-leveling. That is, they will fill the lower parts first, before the upper parts. However, to ensure that the cavities are filled completely, the deposit is thicker than the depth of the cavity. It is then necessary to reduce the thickness of the surplus deposit. This can be done by dry etching on the whole wafer, called "etch back".

It is also possible to use an operation of localized lithography/etching on the topography before CMP.

Figure 13B:
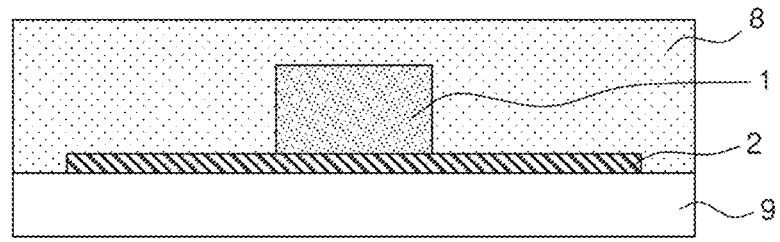

This planarization step is illustrated in FIG. 13b.

Third Step

This involves making primary lower apertures $O_{ip}$ intended for the lower contact.

The dimensions D1, D2, D3 and D4 may typically be as follows:

The dimension D1 (width of dielectric on either side of the mesa of III-V material 1) is at least 200 nm and preferably between 2 and 3 µm.

The dimension D2 (width of the primary lower apertures) may be between 20 and 50 µm.

The dimension D3 (thickness of dielectric) is between 0.5 µm and 5 µm, preferably between 5 and 3 µm.

The dimension D4 (central width between the two primary lower apertures) may be between 0.5 µm and 10 µm, preferably between 1 and 5 µm.

For this, localized etching of the dielectric is carried out (in the case of several layers) to open onto the III-V material 2. Etching may be carried out once up to the III-V material 2 by a dry etching operation. In this case the presence of an etch stop layer is optional.

Sequential etching operations may also be carried out: a first dry etching used for etching a part of the dielectric stack, stopping on a barrier layer (SiN, $Al_2O_3$, $SiO_2$, BCB, SOC preferably SiN) and then using dry or wet etching for etching the barrier layer and the optional underlying layers, opening onto the III-V material 2.

Said etching operation(s) may be carried out directly via the resin used for photolithography or preferably using a hard mask for example consisting of SiN.

Figure 13C:
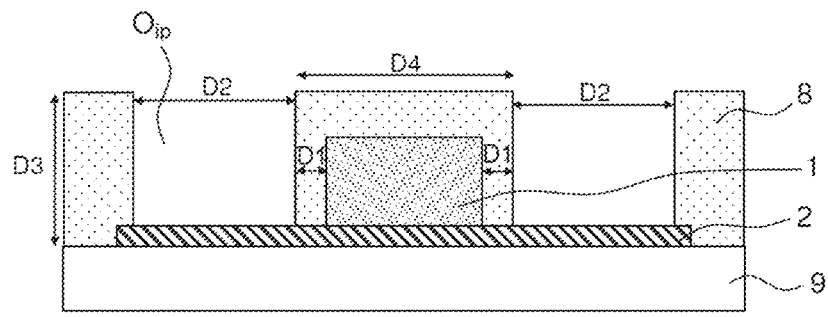

This step of making apertures is illustrated in FIG. 13c.

Fourth Step

This involves depositing metallization compatible with a silicon process flow to define the lower contact, making it possible to avoid the use of noble metals, metals that are not used by the silicon process flow.

Metallization compatible with a silicon process flow may be carried out according to two options:

option 1:
(a) deposition of a metal 3 compatible with a silicon process flow, such as $Ni_2P$, $Ni_3P$, NiGe, TiP, TiGe, etc. is carried out;
Phase stabilization may be undertaken by an optional heat treatment carried out after metal deposition;
(b) deposition of a metal 3 compatible with a silicon process flow such as Ni, Ti and alloy such as NiPt, NiTi, NiCo, etc. is carried out;

option 2: deposition of a metal compatible with a silicon process flow (Ni, Ti and their alloys) is carried out; then a heat treatment is carried out with the aim of performing a solid-state reaction between the metal and the III-V material leading to the formation of one or more intermetallic compounds.

The deposition temperatures are preferably $\leq 450°$ C.

The annealing temperature is preferably $\leq 450°$ C.

According to option 1, the metal or the intermetallic compound is deposited and the work function of the latter is utilized. In this case annealing serves to heal the interface defects and crystallize the metal or the compound.

According to option 2, the metal is deposited, and it is reacted to form the intermetallic compound having the required work function. In this case annealing serves for the solid-state reaction.

Selective removal of the unreacted metal may be carried out after heat treatment.

Figure 13D:
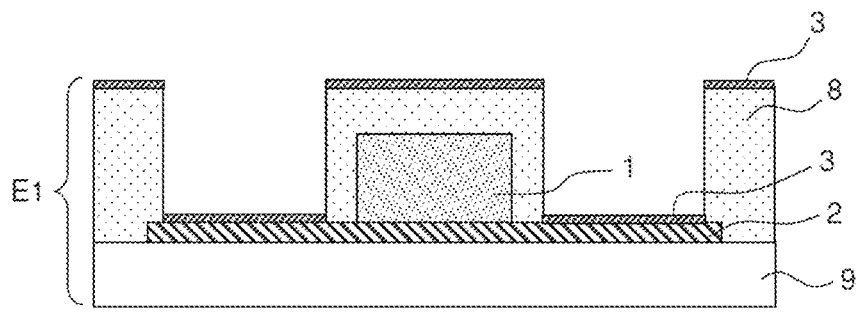

An assembly E1 illustrated in FIG. 13d is then obtained.

Fifth Step

This involves an encapsulation step of the assembly E1 with dielectric 8. The dielectric(s) used may be: SiN, $SiO_2$, $Al_2O_3$, polymer of the planarizing type (for example BCB, SOG). The deposit may be single-layer or multilayer. They are deposited by PVD, CVD and/or ALD;

The deposition temperature is ≤450° C., preferably ≤300° C.

Figure 13E:
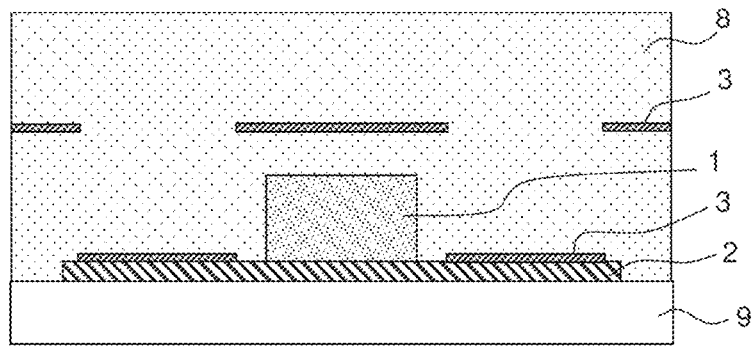

This step is illustrated in FIG. 13e.

The operations of phase stabilization or of heat treatment to form one or more intermetallic compounds may be carried out at the end of this step, if they were not carried out at the end of the fourth step.

Sixth Step

This involves planarization of the dielectric by a CMP operation or an operation of the "etch back" type in the case of a planarizing polymer.

Figure 13F:
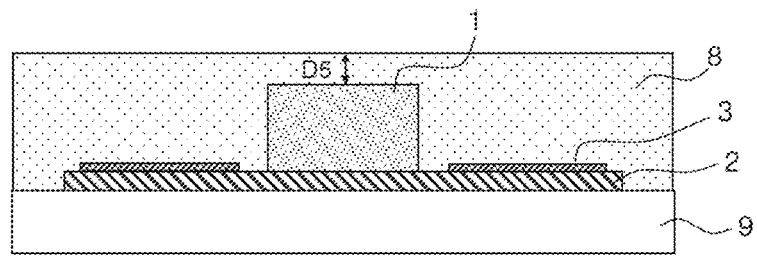

CMP or "etch back" planarization may be carried out:
if selective removal was not carried out in the fourth step, until removal of the metal;
if selective removal was not carried out in the fourth step, and if the operation of the CMP or "etch back" type of the metal is impossible, with stopping on the metal. The step of selective removal of the metal may then be carried out to obtain a structure as illustrated in FIG. 13f;
if selective removal was carried out in the fourth step, until a structure is obtained as illustrated in FIG. 13f.

Typically, the height D5 shown (thickness of dielectric on top of the III-V material 1) may be between 200 nm and 1 μm.

The operations of phase stabilization or of heat treatment to form one or more intermetallic compounds may be carried out at the end of this step, if they were not carried out at the end of the fourth step or at the end of the fifth step.

Seventh Step

This involves an operation of upper secondary lower apertures $O_{is1}$ intended for the connecting pads. For this, etching of the dielectric stack is carried out, to open onto the metallization 3 at the lower level.

Etching is carried out once, as far as the metallization: dry etching. In this case the presence of an etch stop layer is optional.

Sequential etching may be employed: a first dry etching is used for etching a part of the dielectric stack, stopping on a barrier layer (SiN, $Al_2O_3$, $SiO_2$, BCB, SOC, preferably SiN), and then dry or wet etching is used for etching the barrier layer and the optional underlying layers, opening onto the metallization 3.

Figure 13G:
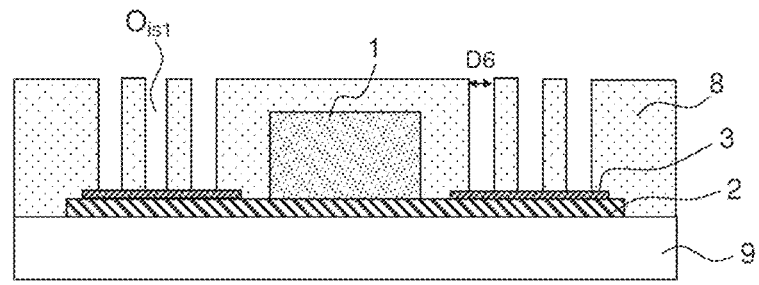

Said etching operation(s) may be carried out directly via the resin used for photolithography or using a hard mask consisting for example of SiN. Typically the dimension D6 (width of the secondary lower apertures) of dielectric shown may be between 0.5 μm and 5 μm and is preferably between 1 μm and 3 μm. This step is illustrated in FIG. 13g.

Eighth Step

This involves filling the secondary lower apertures and a CMP operation for making connecting pads. Filling of the secondary lower apertures is carried out twice:
deposition of a diffusion barrier/of a keying or nucleation layer 4 is carried out. It may consist of TiN, Ti/TiN, TaN, Ta/TaN or of W deposited by CVD, PVD or ALD;
deposition of a filling metal 5 (W, Cu, AlCu, AlSi) is carried out, deposited by CVD, ECD or PVD.

A CMP operation is finally carried out for decontacting the pads. As metal is present at the top of the cavities between two pads, short-circuiting is inevitable. The CMP operation makes it possible to remove only the metal from the pads and therefore decontact them.

Figure 13H:
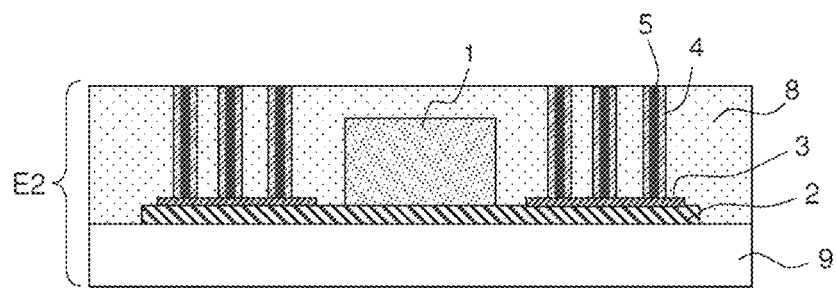

A new assembly E2 is produced. All of these steps are illustrated in FIG. 13h.

Ninth Step

Figure 13I:
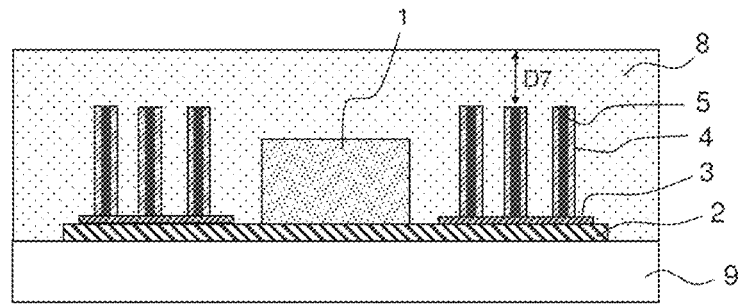

This involves an operation of encapsulation with a dielectric 8. The dielectric(s) used may be: SiN, $SiO_2$, $Al_2O_3$, a polymer of the planarizing type (for example BCB, SOG). The deposit may be single-layer or multilayer. The dielectrics are deposited by PVD, CVD and/or ALD. The deposition temperature is ≤450° C., preferably ≤300° C. Typically the height D7 of dielectric shown may be between 200 nm and 1 μm and is preferably between 200 nm and 500 nm. This step is illustrated in FIG. 13i.

Tenth Step

This involves making a primary upper aperture $O_{sp}$ for forming an upper contact.

This involves etching the dielectric stack to open onto the III-V material 1. Etching may be carried out once as far as the III-V material 1 by dry etching. In this case the presence of an etch stop layer is optional.

Sequential etching may be employed: a first dry etching is used for etching a part of the dielectric stack, stopping on a barrier layer (SiN, $Al_2O_3$, $SiO_2$, BCB, SOC preferably SiN) and then dry or wet etching is used for etching the barrier layer and the optional underlying layers, opening onto the III-V material 1.

Said etching operation(s) may be carried out directly via the resin used for photolithography or preferably using a hard mask for example consisting of SiN.

Figure 13J:
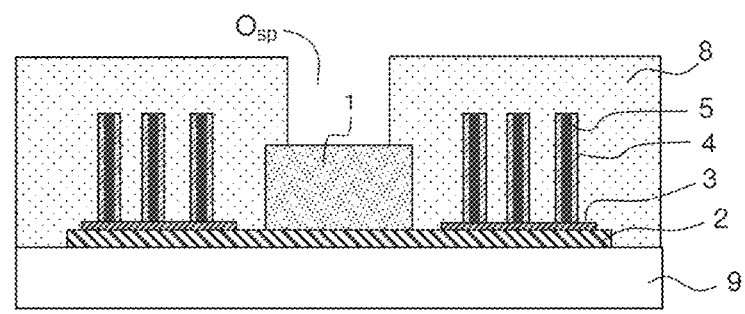

This step is illustrated in FIG. 13j.

Eleventh Step

This involves the deposition of the metallization 3 compatible with a silicon process flow intended for the upper contact. Metallization compatible with a silicon process flow may be carried out in two ways:
option 1:
(a) deposition of a metal 3 compatible with a silicon process flow such as $Ni_2P$, $Ni_3P$, NiGe, TiP, TiGe, etc. is carried out;
Phase stabilization may be undertaken by an optional heat treatment carried out after metal deposition;
(b) deposition of a metal 3 compatible with a silicon process flow such as Ni, Ti and alloy such as NiPt, NiTi, NiCo, etc. is carried out;
option 2: deposition of a metal compatible with a silicon process flow (Ni, Ti and their alloys) is carried out; then a heat treatment is carried out with the aim of performing a solid-state reaction between the metal and the III-V material leading to the formation of one or more intermetallic compounds.

The annealing temperature is preferably ≤450° C.

Selective removal of the unreacted metal may be carried out after heat treatment. A third assembly E3 is obtained.

Figure 13K:
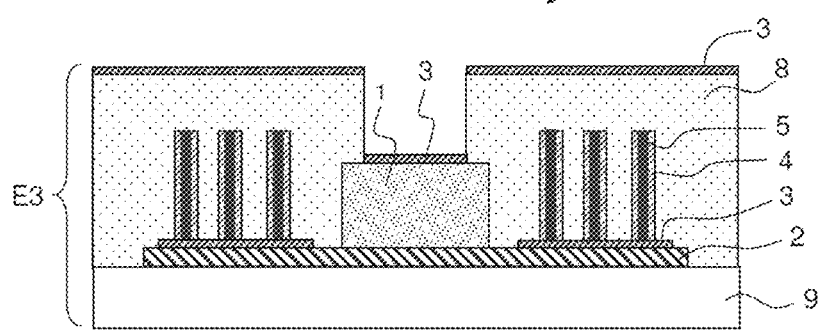

This step is illustrated in FIG. 13k.

Twelfth Step

This involves encapsulation of the third assembly E3. The dielectric(s) used may be: SiN, $SiO_2$, $Al_2O_3$, polymer of the planarizing type (for example BCB), SOG. The deposit may be single-layer or multilayer. They are deposited by PVD, CVD and/or ALD. The deposition temperature is ≤450° C., preferably ≤300° C.

Figure 13L:
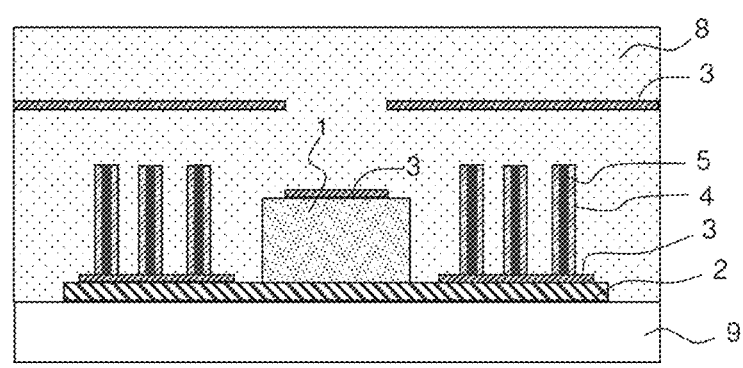

This step is illustrated in FIG. 13*l*.

The operations of phase stabilization or of heat treatment to form one or more intermetallic compounds may be carried out at the end of this step, if they were not carried out at the end of the eleventh step.

Thirteenth Step

Figure 13M:
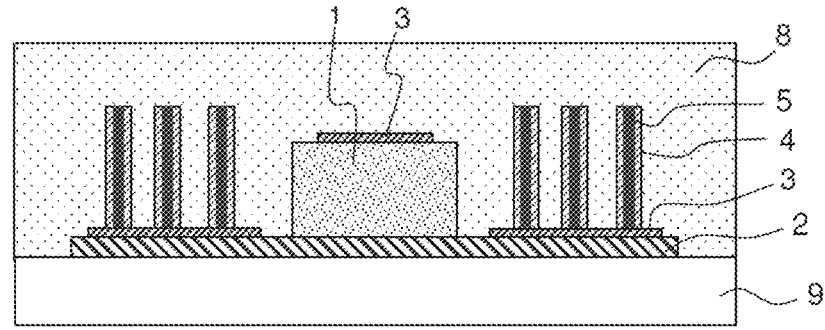

This involves a planarization operation.
Planarization or etch back may be carried out:
if selective removal was not carried out in the eleventh step, until removal of the metal;
if selective removal was not carried out in the eleventh step, and if the operation of CMP or "etch back" of the metal is impossible, with stopping on the metal. The step of selective removal of the metal may then be carried out to obtain a structure as shown in FIG. 4*m*;
if selective removal was carried out in the eleventh step, until the structure illustrated in FIG. 13*m* is obtained.
The operations of phase stabilization or of heat treatment to form one or more intermetallic compounds may be carried out at the end of this step, if they were not carried out at the end of the eleventh step or at the end of the twelfth step.

Fourteenth Step

This involves making a secondary upper aperture $O_{ss}$ and making additional upper apertures $O_{is2}$ on top of at least the contact pads of a lower contact.

This involves etching the dielectric stack to open onto the metallization of the upper contact level and onto the contact pads of the lower contact.

Etching is carried out once, as far as the metallization 3 and as far as the pads of the lower level, by dry etching. In this case the presence of an etch stop layer is optional.

Operations of sequential etching may be carried out: a first dry etching is used for etching a part of the dielectric stack, stopping on a barrier layer (SiN, $Al_2O_3$, $SiO_2$, BCB, SOC, preferably SiN) on the upper contact bottom metallization and on the pads of the lower contact.

Dry or wet etching may be used for etching the barrier layer and the optional underlying layers, opening onto the metallization 3.

Said etching operation(s) may be carried out directly via the resin used for photolithography or using a hard mask consisting for example of SiN.

Figure 13N:
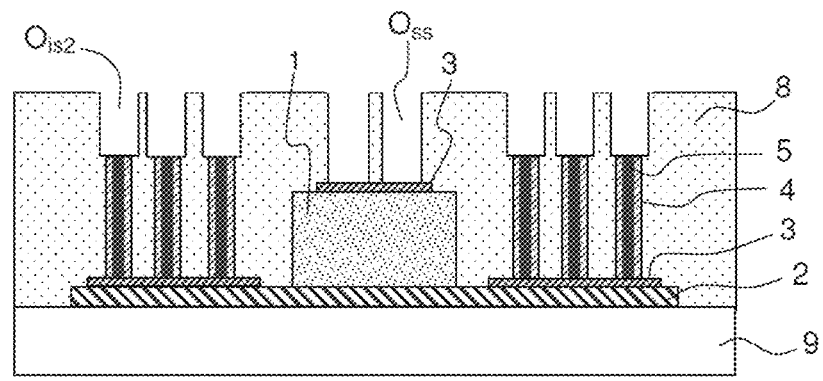

This step is illustrated in FIG. 13*n*.

Fifteenth Step

Figure 13O:
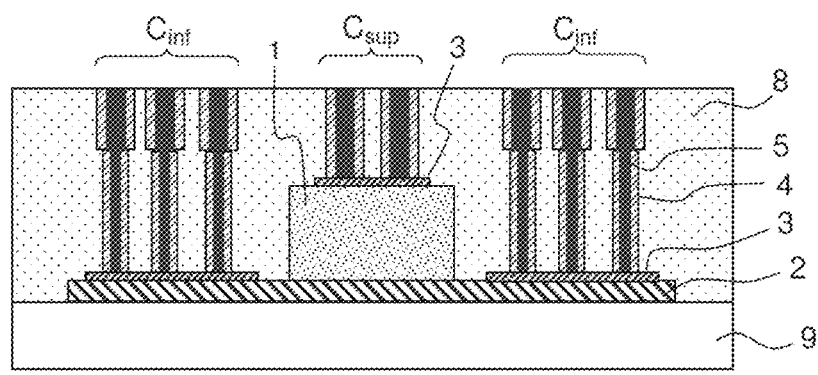

This involves filling the apertures defined in the preceding step.
Filling of the apertures is carried out twice:
deposition of a diffusion barrier/of a keying or nucleation layer is carried out. It may consist of TiN, Ti/TiN, TaN, Ta/TaN or of W deposited by CVD, PVD or ALD;
deposition of a filling metal (W, Cu, AlCu, AlSi etc.) is carried out, deposited by CVD, ECD or PVD.
A CMP operation is finally carried out for decontacting the pads.
This step is illustrated in FIG. 13*o* and leads to production of the upper contacts $C_{sup}$ and lower contacts $C_{inf}$.

An alternative to the first process example may comprise sequential production of the primary apertures coupled to simultaneous production of the secondary apertures.

Second Example of a Process According to the Invention Comprising the Production of Upper Contacts Followed by the Production of Lower Contacts According to the Second Alternative of the Invention First Step This involves encapsulation of the structure previously produced, comprising a mesa of a first III-V material 1 on the surface of a base of a III-V material 2 on a substrate 9.

The dielectric(s) 8 used may be: SiN, $SiO_2$, $Al_2O_3$, polymer of the planarizing type (for example BCB, SOG).

The deposit may be single-layer or multilayer.
The dielectrics are deposited by PVD, CVD and/or ALD. The deposition temperature may typically be ≤450° C., preferably ≤300° C.

Figure 14A:
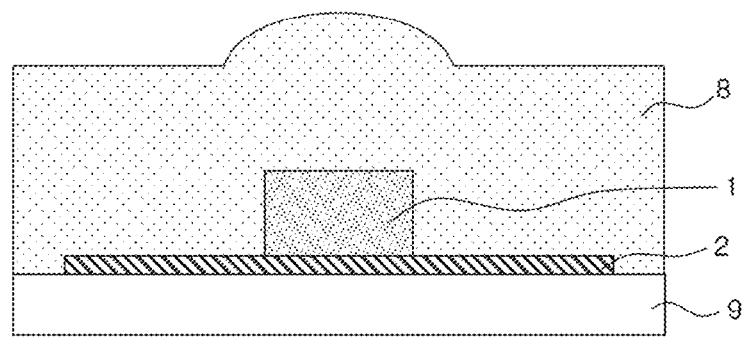
FIGS. 14a to 14n illustrate the various steps of a second example of the process of the invention carried out in the context of the second alternative of the present invention comprising production of the upper contacts and then the lower contacts.

The stress of the layers produced may be ≤200 MPa, preferably ≤100 MPa. This encapsulation step is illustrated in FIG. 14*a*.

Second Step

Figure 14B:
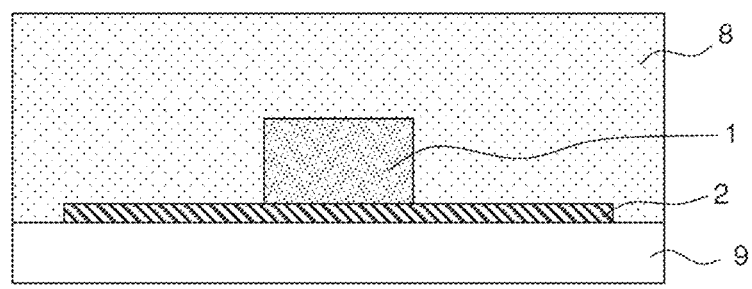

This involves planarization of the dielectric by an operation of the CMP type or "etch back" type in the case of a planarizing polymer. It is also possible to use an operation of localized lithography/etching on the topography before CMP. This planarization step is illustrated in FIG. 14*b*.

Third Step

This involves making a primary upper aperture $O_{sp}$ intended for the upper contact.

For this, localized etching of the dielectric is carried out (in the case of several layers) to open onto the III-V material 1. Etching may be carried out once up to the III-V material 1 by a dry etching operation. In this case the presence of an etch stop layer is optional.

Sequential etching operations may also be carried out: a first dry etching used for etching a part of the dielectric stack, stopping on a barrier layer (SiN, $Al_2O_3$, $SiO_2$, BCB, SOC preferably SiN) and then using dry or wet etching for etching the barrier layer and the optional underlying layers, opening onto the III-V material 1.

Said etching operation(s) may be carried out directly via the resin used for photolithography or preferably using a hard mask for example consisting of SiN.

Figure 14C:
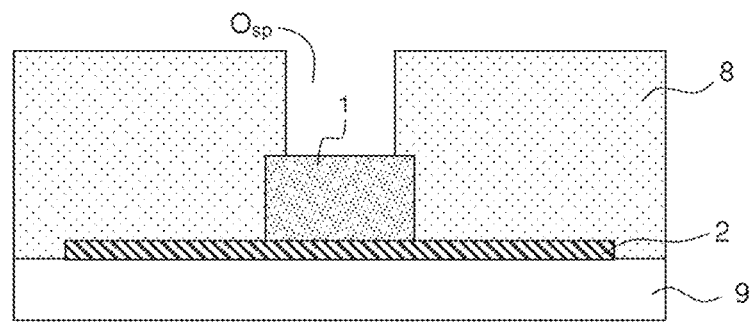

This step of making apertures is illustrated in FIG. 14*c*.

Fourth Step

This involves depositing a metallization 3 compatible with a silicon process flow on the III-V material 1.
Metallization may be carried out according to two options:
option 1:
(a) deposition of a metal 3 compatible with a silicon process flow such as $Ni_2P$, $Ni_3P$, NiGe, TiP, TiGe, etc. is carried out;
Phase stabilization may be undertaken by an optional heat treatment carried out after metal deposition;

(b) deposition of a metal 3 compatible with a silicon process flow such as Ni, Ti and alloy such as NiPt, NiTi, NiCo, etc. is carried out;

option 2: deposition of a metal compatible with a silicon process flow (Ni, Ti and their alloys) is carried out; then a heat treatment is carried out with the aim of performing a solid-state reaction between the metal and the III-V material leading to the formation of one or more intermetallic compounds.

The annealing temperature is preferably ≤450° C.

Selective removal of the unreacted metal may be carried out after heat treatment.

Figure 14D:
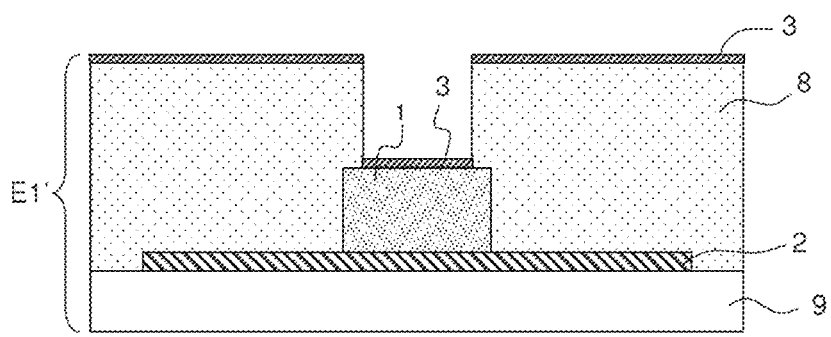

An assembly E1' illustrated in FIG. 14d is then obtained.

Fifth Step

This involves a step of encapsulation of the assembly E1' with dielectric 8. The dielectric(s) used may be: SiN, $SiO_2$, $Al_2O_3$, polymer of the planarizing type (for example BCB, SOG). The deposit may be single-layer or multilayer. They are deposited by PVD, CVD and/or ALD.

The deposition temperature is ≤450° C., preferably ≤300° C.

Figure 14E:
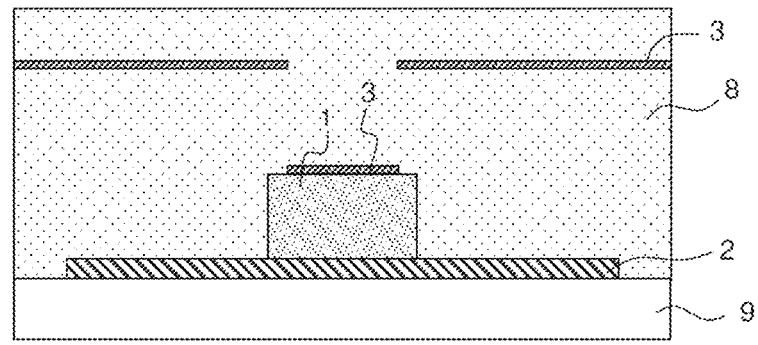

This step is illustrated in FIG. 14e.

The operations of phase stabilization or of heat treatment to form one or more intermetallic compounds may be carried out at the end of this step, if they were not carried out at the end of the fourth step.

Sixth Step

Figure 14F:
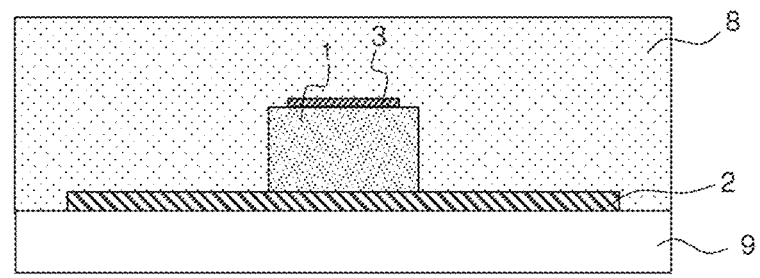

This involves planarization of the dielectric by an operation of the CMP type or "etch back" type in the case of a planarizing polymer. These operations may be carried out:

if selective removal was not carried out in the fourth step, until removal of the metal;

if selective removal was not carried out in the fourth step, and if the operation of the CMP type or "etch back" type of the metal is impossible, with stopping on the metal. The step of selective removal of the metal may then be carried out to obtain a structure as illustrated in FIG. 14f;

if selective removal was carried out in the fourth step, until a structure is obtained as illustrated in FIG. 14f.

The operations of phase stabilization or of heat treatment to form one or more intermetallic compounds may be carried out at the end of this step, if they were not carried out at the end of the fourth step or at the end of the fifth step.

Seventh Step

This involves an operation of secondary upper apertures $O_{ss}$ intended for the connecting pads. For this, etching of the dielectric stack is carried out, to open onto the metallization 3 at the upper level.

Etching is carried out once, as far as the metallization, which may be by dry etching. In this case the presence of an etch stop layer is optional.

Sequential etching may be employed: a first dry etching is used for etching a part of the dielectric stack, stopping on a barrier layer (SiN, $Al_2O_3$, $SiO_2$, BCB, SOC, preferably SiN), and then dry or wet etching is used for etching the barrier layer and the optional underlying layers, opening onto the metallization 3.

Said etching operation(s) may be carried out directly via the resin used for photolithography or using a hard mask consisting for example of SiN.

Figure 14G:
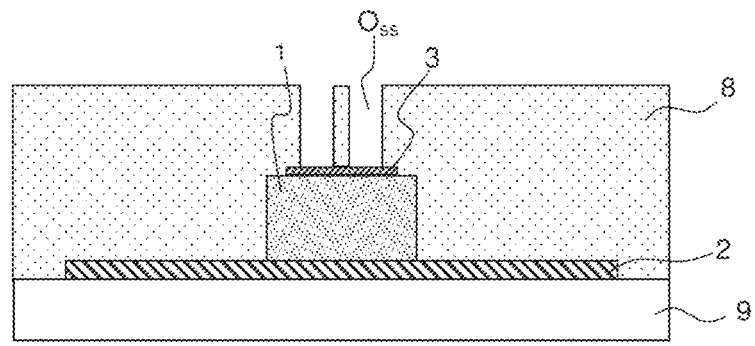

This step is illustrated in FIG. 14g.

Eighth Step

This involves filling the apertures $O_{ss}$ and a CMP operation for making connecting pads.

Filling of the apertures $O_{ss}$ is carried out twice:

deposition of a diffusion barrier/of a keying or nucleation layer is carried out. It may consist of TiN, Ti/TiN, TaN, Ta/TaN or of W deposited by CVD, PVD or ALD;

deposition of a filling metal (W, Cu, AlCu, AlSi, etc.) is carried out, deposited by CVD, ECD or PVD.

Figure 14H:
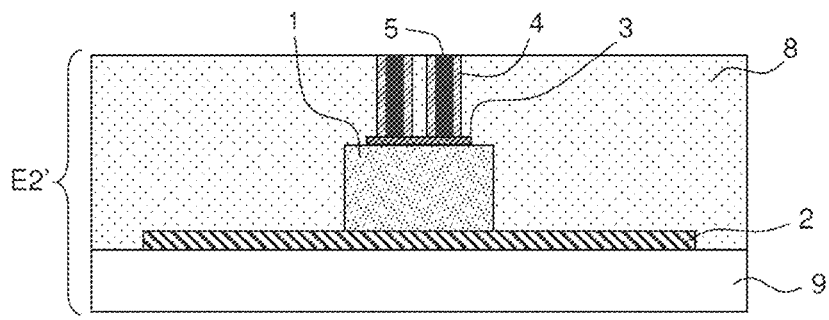

CMP is finally carried out for decontacting the pads. A new assembly E2' is produced. All of these steps are illustrated in FIG. 14h.

Ninth Step

This involves making primary lower apertures $O_{ip}$ for producing lower contacts.

This involves etching the dielectric stack to open onto the III-V material 2. Etching may be carried out once as far as the III-V material 2 by dry etching. In this case the presence of an etch stop layer is optional.

Sequential etching may be employed: a first dry etching is used for etching a part of the dielectric stack, stopping on a barrier layer (SiN, $Al_2O_3$, $SiO_2$, BCB, SOC preferably SiN) and then dry or wet etching is used for etching the barrier layer and the optional underlying layers, opening onto the III-V material 2.

Said etching operation(s) may be carried out directly via the resin used for photolithography or preferably using a hard mask for example consisting of SiN.

Figure 14I:
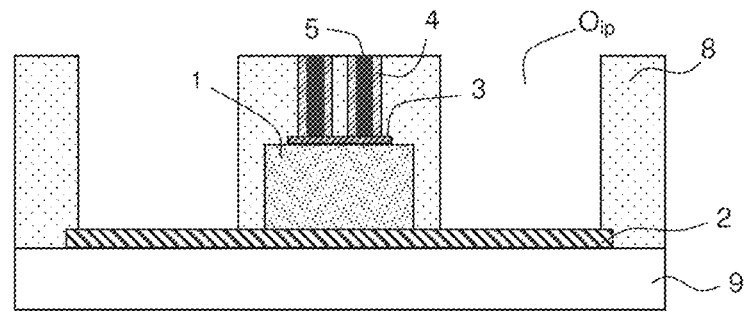

This step is illustrated in FIG. 14i.

Tenth Step

This involves deposition of the metallization 3 compatible with a silicon process flow intended for the lower contacts. The CMOS compatible metallization may be carried out in two ways:

It involves deposition of the metallization 3 compatible with a silicon process flow intended for the upper contact. Metallization may be carried out in two ways:

option 1:

(a) deposition of a metal 3 compatible with a silicon process flow such as $Ni_2P$, $Ni_3P$, NiGe, TiP, TiGe, etc. is carried out;

Phase stabilization may be undertaken by an optional heat treatment carried out after metal deposition;

(b) deposition of a metal 3 compatible with a silicon process flow such as Ni, Ti and alloy such as NiPt, NiTi, NiCo, etc. is carried out;

option 2: deposition of a metal compatible with a silicon process flow (Ni, Ti and their alloys) is carried out; then a heat treatment is carried out with the aim of performing a solid-state reaction between the metal and the III-V material leading to the formation of one or more intermetallic compounds.

The deposition temperatures are preferably ≤450° C.

The annealing temperature is preferably ≤450° C.

Selective removal of the unreacted metal may be carried out after heat treatment. A third assembly E3' is obtained.

Figure 14J:
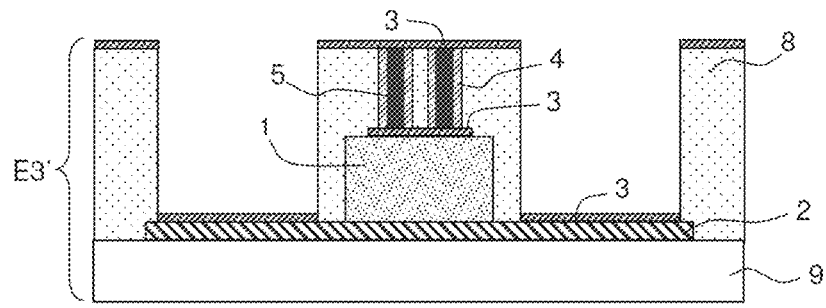

This step is illustrated in FIG. 14j.

Eleventh Step

This involves a step of encapsulation of the assembly E3' with dielectric 8. The dielectric(s) used may be: SiN, $SiO_2$, $Al_2O_3$, polymer of the planarizing type (for example BCB), SOG. The deposit may be single-layer or multilayer. They are deposited by PVD, CVD and/or ALD.

The deposition temperature is ≤450° C., preferably ≤300° C.

Figure 14K:
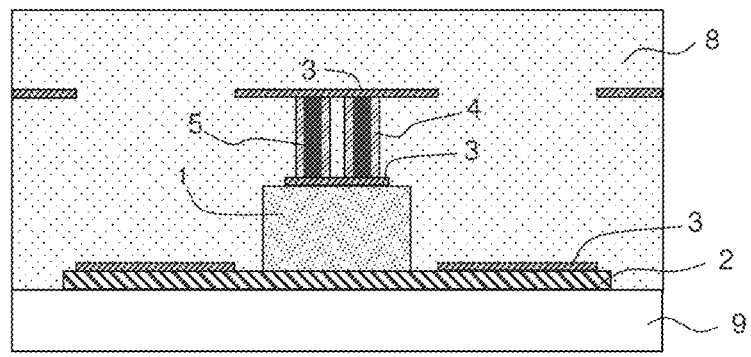

This step is illustrated in FIG. 14k.

The operations of phase stabilization or of heat treatment to form one or more intermetallic compounds may be carried out at the end of this step, if they were not carried out at the end of the tenth step.

Twelfth Step

This involves an operation of planarization of the dielectric by an operation of the CMP type or "etch back" type in the case of a planarizing polymer.

Figure 14L:
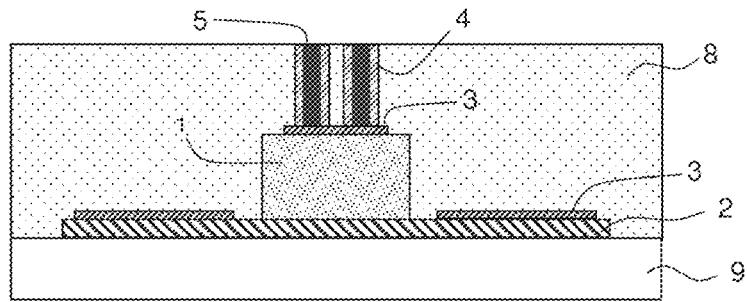

This step is illustrated in FIG. 14l.

The operations of phase stabilization or of heat treatment to form one or more intermetallic compounds may be carried out at the end of this step, if they were not carried out at the end of the tenth step or at the end of the twelfth step.

Thirteenth Step

This involves an operation of secondary lower apertures O is intended for the connecting pads. For this, etching of the dielectric stack is carried out, to open onto the metallization 3 at the lower level.

Etching is carried out once, as far as the metallization by dry etching. In this case the presence of an etch stop layer is optional.

Sequential etching may be employed: a first dry etching is used for etching a part of the dielectric stack, stopping on a barrier layer (SiN, Al2O3, SiO2, BCB, SOC, preferably SiN), and then dry or wet etching is used for etching the barrier layer and the optional underlying layers, opening onto the metallization 3.

Said etching operation(s) may be carried out directly via the resin used for photolithography or using a hard mask consisting for example of SiN. Typically the height D6 of dielectric shown may be between 0.5 µm and 5 µm and is preferably between 1 µm and 3 µm.

Figure 14M:
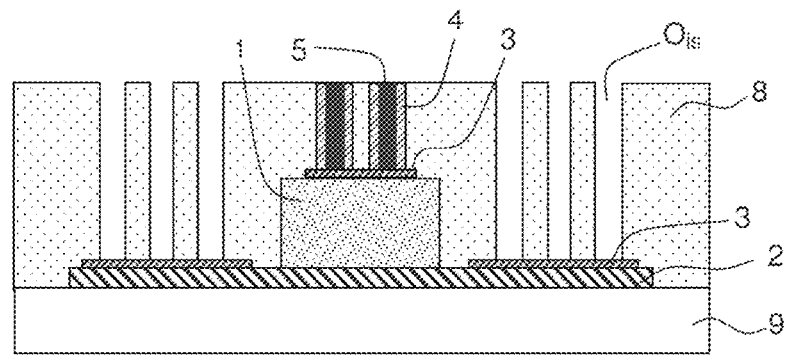

This step is illustrated in FIG. 14m.

Fourteenth Step

This involves filling the apertures defined in the preceding step.

Filling of the apertures is carried out twice:
deposition of a diffusion barrier/of a keying or nucleation layer is carried out. It may consist of TiN, Ti/TiN, TaN, Ta/TaN or of W deposited by CVD, PVD or ALD;
deposition of a filling metal (W, Cu) is carried out, deposited by CVD, ECD or PVD.

A CMP operation is finally carried out for decontacting the pads.

Figure 14N:
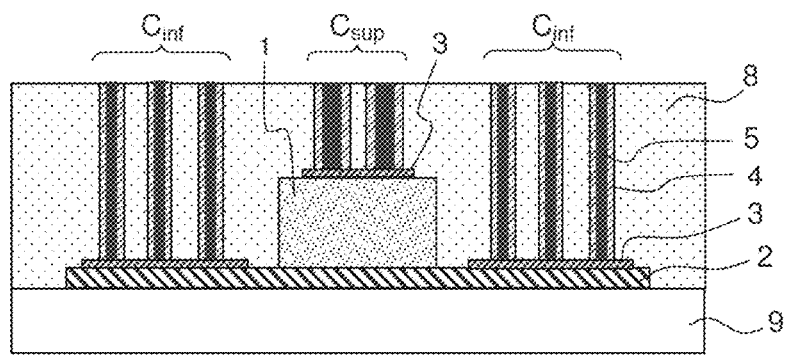

This step is illustrated in FIG. 14n and leads to production of the upper contacts $C_{sup}$ and lower contacts $C_{inf}$.

An alternative to the second process example may comprise sequential production of the primary apertures coupled to simultaneous production of the secondary apertures.

Third example of a process according to the invention comprising the simultaneous production of an upper contact and a lower contact according to the second alternative of the invention:

First Step

This involves encapsulation of the structure previously produced, comprising a mesa of a first III-V material 1 on the surface of a base of a III-V material 2 on a substrate 9.

The dielectric(s) 8 used may be: SiN, $SiO_2$, $Al_2O_3$, polymer of the planarizing type (for example BCB, SOG).

The deposit may be single-layer or multilayer.

The dielectrics are deposited by PVD, CVD and/or ALD. The deposition temperature may typically be ≤450° C., preferably ≤300° C.

Figure 15A:
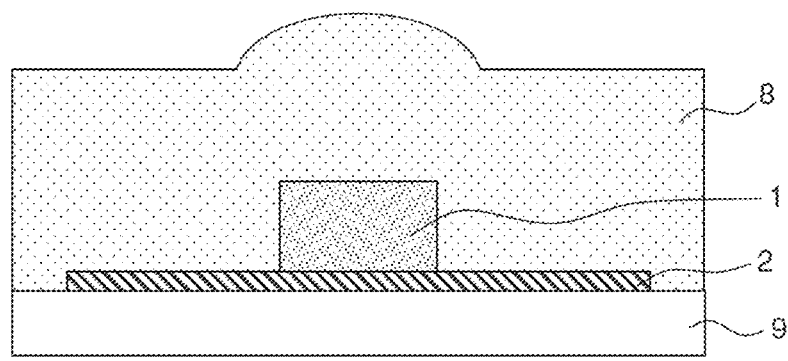
FIGS. 15a to 15h illustrate the various steps of a third example of a process carried out in the context of the second alternative of the invention comprising producing the lower and upper contacts simultaneously.

The stress of the layers produced may be ≤200 MPa, preferably ≤100 MPa. This encapsulation step is illustrated in FIG. 15a.

Second Step

Figure 15B:
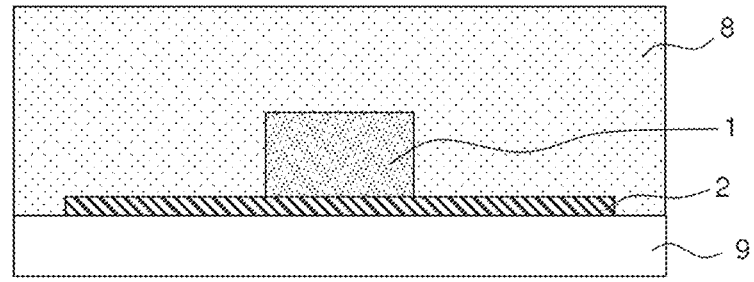

This involves planarization of the dielectric by an operation of the CMP type or "etch back" type in the case of a planarizing polymer. It is also possible to use an operation of localized lithography/etching on the topography before CMP. This planarization step is illustrated in FIG. 15b.

Third Step

This involves making primary lower apertures $O_{ip}$ intended for the lower contact and a primary upper aperture $O_{sp}$ intended for the upper contact.

For this, localized etching of the dielectric is carried out (in the case of several layers) to open onto the III-V material 2 and to open onto the III-V material 1.

Etching may be carried out once up to the III-V material 2 and up to the material 1 by a dry etching operation. In this case the presence of an etch stop layer is optional.

Sequential etching operations may also be carried out: a first dry etching used for etching a part of the dielectric stack, stopping on a barrier layer (SiN, $Al_2O_3$, $SiO_2$, BCB, SOC preferably SiN) and then using dry or wet etching for etching the barrier layer and the optional underlying layers, opening onto the III-V material 2 and onto the III-V material 1.

Said etching operation(s) may be carried out directly via the resin used for photolithography or preferably using a hard mask for example consisting of SiN.

Figure 15C:
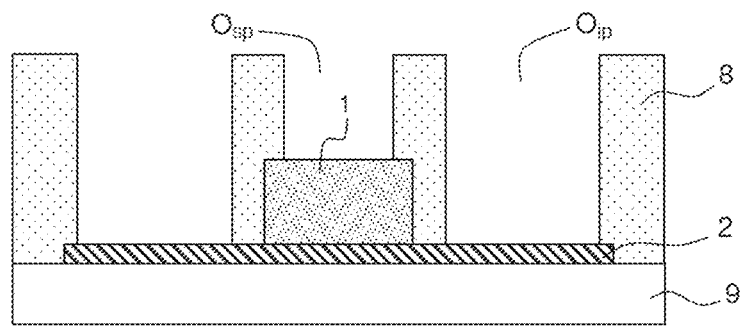

This step of making apertures is illustrated in FIG. 15c.

Fourth Step

This involves depositing a metallization 3 compatible with a silicon process flow on the III-V material 1 and on the III-V material 2.

This involves deposition of the metallization 3 compatible with a silicon process flow intended for the upper contact. Metallization may be carried out in two ways:

option 1:
(a) deposition of a metal 3 compatible with a silicon process flow such as $Ni_2P$, $Ni_3P$, NiGe, TiP, TiGe, etc. is carried out;
Phase stabilization may be undertaken by an optional heat treatment carried out after metal deposition;
(b) deposition of a metal 3 compatible with a silicon process flow such as Ni, Ti and alloy such as NiPt, NiTi, NiCo, etc. is carried out;
option 2: deposition of a metal compatible with a silicon process flow (Ni, Ti and their alloys) is carried out; then a heat treatment is carried out with the aim of performing a solid-state reaction between the metal and the III-V material leading to the formation of one or more intermetallic compounds.

The annealing temperature is preferably ≤450° C.

Selective removal of the unreacted metal may be carried out after heat treatment.

Figure 15D:
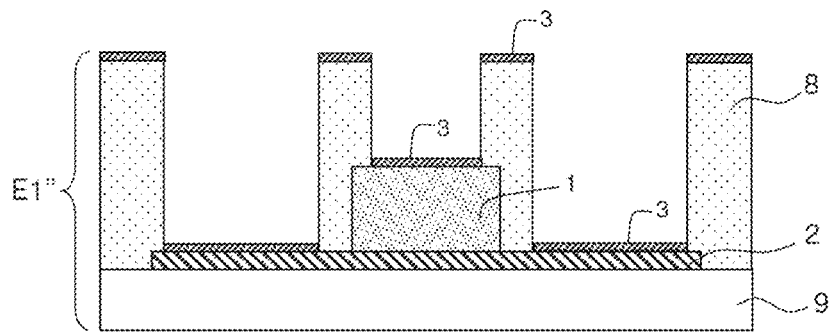

An assembly E1" illustrated in FIG. 15d is then obtained.

Fifth Step

This involves a step of encapsulation of the assembly E1" with dielectric 8. The dielectric(s) used may be: SiN, $SiO_2$, $Al_2O_3$, polymer of the planarizing type (for example BCB, SOG). The deposit may be single-layer or multilayer. They are deposited by PVD, CVD and/or ALD.

The deposition temperature is ≤450° C., preferably ≤300° C.

Figure 15E:
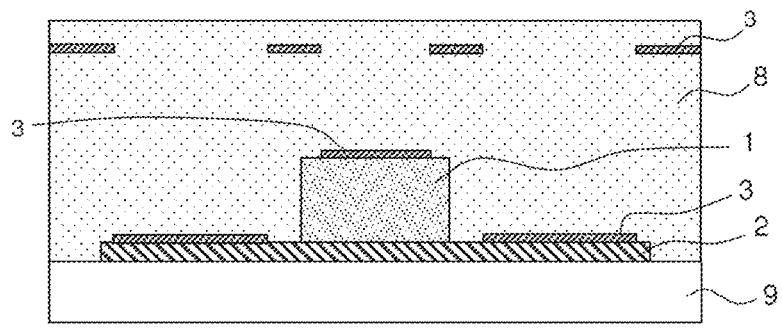

This step is illustrated in FIG. 15e.

The operations of phase stabilization or of heat treatment to form one or more intermetallic compounds may be carried out at the end of this step, if they were not carried out at the end of the fourth step.

Sixth Step

Figure 15F:
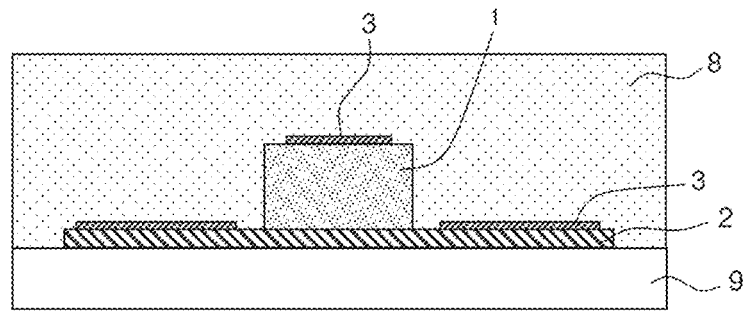

This involves planarization of the dielectric by an operation of the CMP type or "etch back" type in the case of a planarizing polymer. These operations may be carried out:
 if selective removal was not carried out in the fourth step, until removal of the metal;
 if selective removal was not carried out in the fourth step, and if the operation of the CMP type or "etch back" type of the metal is impossible, with stopping on the metal. The step of selective removal of the metal may then be carried out to obtain a structure as illustrated in FIG. 15f;
 if selective removal was carried out in the fourth step, until a structure is obtained as illustrated in FIG. 15f.

The operations of phase stabilization or of heat treatment to form one or more intermetallic compounds may be carried out at the end of this step, if they were not carried out at the end of the fourth step or at the end of the fifth step.

Seventh Step

This involves an operation of secondary upper apertures $O_{ss}$ and secondary lower apertures $O_{is}$ intended for the connecting pads. For this, etching of the dielectric stack is carried out, to open onto the metallization 3 at the upper level and at the lower level.

Etching is carried out once, as far as the metallization by dry etching. In this case the presence of an etch stop layer is optional.

Sequential etching may be employed: a first dry etching is used for etching a part of the dielectric stack, stopping on a barrier layer (SiN, $Al_2O_3$, $SiO_2$, BCB, SOC, preferably SiN), and then dry or wet etching is used for etching the barrier layer and the optional underlying layers, opening onto the metallization 3.

Said etching operation(s) may be carried out directly via the resin used for photolithography or using a hard mask consisting for example of SiN.

Figure 15G:
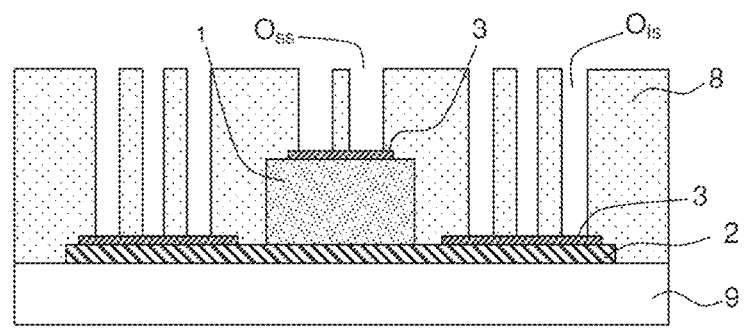

This step is illustrated in FIG. 15g.

Eighth Step

This involves filling the apertures defined in the preceding step.

Filling of the apertures is carried out twice:
 deposition of a diffusion barrier/of a keying or nucleation layer is carried out. It may consist of TiN, Ti/TiN, TaN, Ta/TaN or of W deposited by CVD, PVD or ALD;
 deposition of a filling metal (W, Cu) is carried out, deposited by CVD, ECD or PVD.

A CMP operation is finally carried out for decontacting the pads.

Figure 15H:
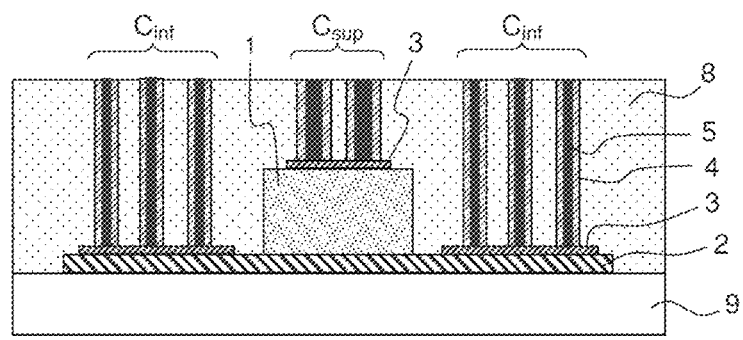

This step is illustrated in FIG. 15h and leads to production of the upper contacts $C_{sup}$ and lower contacts $C_{inf}$.

An alternative to the three examples of processes described above consists of making contact pads having several segments for the lower contact.

Fourth Process Example According to the Second Alternative of the Invention

First Step

According to substeps identical to those described above, an assembly is produced comprising:
 a substrate 9;
 a III-V material 1;
 a III-V material 2;
 metallizations 3.

Figure 16A:
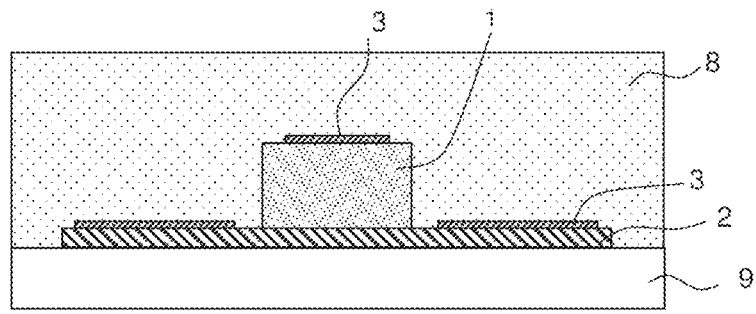
FIGS. 16a to 16d illustrate the various steps of a fourth example of the process of the invention comprising producing double-level secondary upper and lower apertures simultaneously, in the context of the second alternative of the invention.

The assembly is encapsulated in a dielectric 8 and is illustrated in FIG. 16a.

Second Step

This involves making secondary lower apertures $O_{is1}$ by partial etching of the previously constituted assembly, or by partial etching of the dielectric 8. Dry etching may be used. In this case the presence of an etch stop layer is optional.

Said etching operation(s) may be carried out directly via a resin used for photolithography or using a hard mask consisting for example of SiN.

Figure 16B:
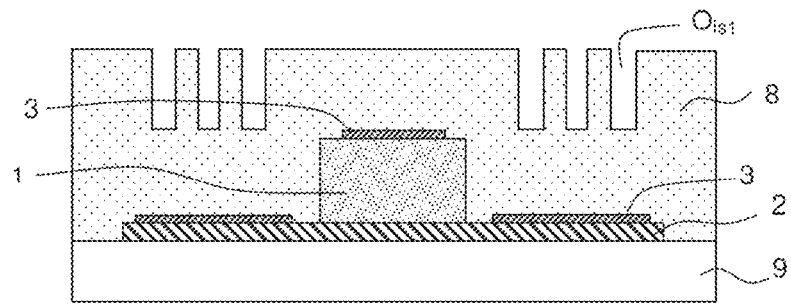

This step is illustrated in FIG. 16b.

Third Step

A second etching operation is carried out for a second time, for lengthening the secondary lower apertures, by making the apertures $O_{is2}$ in the prolongation of the apertures previously produced $O_{is1}$, and making secondary upper apertures $O_{ss}$ so as to open onto the metallizations 3.

The etching operation may be carried out once as far as the metallization, by dry etching. In this case the presence of an etch stop layer is optional.

Preferably, sequential etching operations may be carried out: a first dry etching used for etching a part of the dielectric stack, stopping on a barrier layer (SiN, $Al_2O_3$, $SiO_2$, BCB, SOC, preferably SiN) and then using dry or wet etching for etching the barrier layer and the optional underlying layers, opening onto the metallizations.

Said etching operation(s) may be carried out directly via the resin used for photolithography or using a hard mask consisting for example of SiN.

Figure 16C:
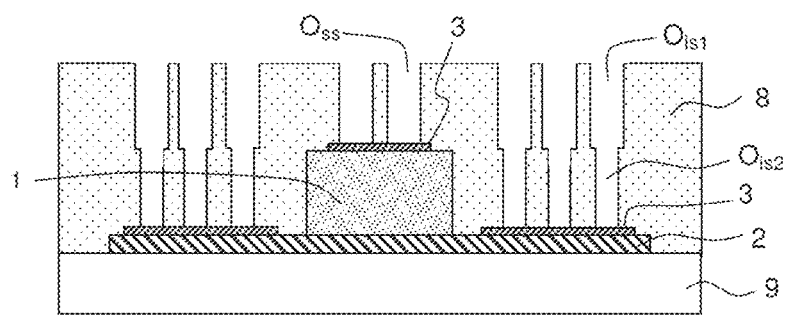

This step is illustrated in FIG. 16c.

Fourth Step

This involves filling the apertures defined in the preceding step.

Filling of the apertures is carried out twice:
- deposition of a diffusion barrier/of a keying or nucleation layer is carried out. It may consist of TiN, Ti/TiN, TaN, Ta/TaN or of W deposited by CVD, PVD or ALD;
- deposition of a filling metal (W, Cu, AlCu, AlSi) is carried out, deposited by CVD, ECD or PVD.

A CMP operation is finally carried out for decontacting the pads.

Figure 16D:
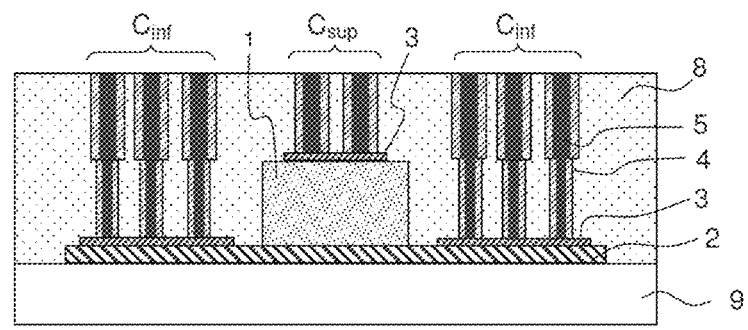

This step is illustrated in FIG. 16d and leads to production of the upper contacts $C_{sup}$ and lower contacts $C_{inf}$.

In general, it is possible to produce an additional contact level on the surface of the planar contacts previously produced and notably described in the preceding examples of the process according to the invention.

Figure 17:
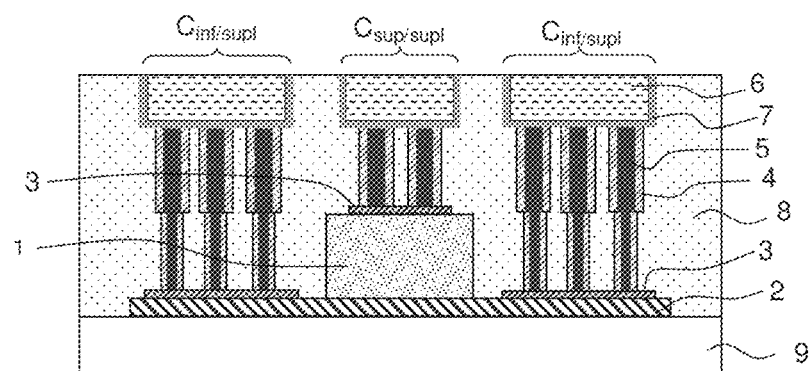
FIG. 17 illustrates a step of integration of an additional contact level that may be employed in variants of the process of the invention.

An additional step may thus be carried out by additional deposition of dielectric 8, then making additional upper and lower apertures by etching and filling these apertures to define the contacts $C_{inf/sup1}$ and $C_{sup/sup1}$ as illustrated in FIG. 17.

For this, in the additional upper and lower apertures, a barrier 7 is deposited, which may be of TiN, Ti/TiN, TaN, Ta/TaN, W and filling with a metal 6, which may be W, Cu or Al, AlCu, AlSi.

It should be noted that the additional contact level may also be produced by etching a metallic stack made beforehand via a resin or a hard mask.

Example of a Laser Component Produced by the Process of the Invention

The process of the present invention may be used advantageously for making a laser based on III-V materials:

A substrate 90 of $SiO_2$ comprises a silicon guide 91, on top of which the following are produced:
- a base of second III-V material 2, which may be of n-doped InP and a mesa 1 comprising a multiple quantum well structure that may be made of InGaAsP with different dopings and a layer of p-doped InGaAs, the nature of the III-V materials determining the emission wavelength;
- the dielectric 8 may be of SiN, $SiO_2$, or of polymer of the planarizing type for example based on BOB;
- the contact bottom metallization 3 may be for example of Ni, Ti, or alloys thereof ($Ni_2P$, $Ni_3P$, NiGe, TiP, TiGe, etc.);
- the diffusion barrier to F and/or the keying layer to W 4 may be of TiN, Ti/TiN, TaN, Ta/TaN, W;

The filling metal 5 may be Cu or Al, AlCu, AlSi.

Figure 18:
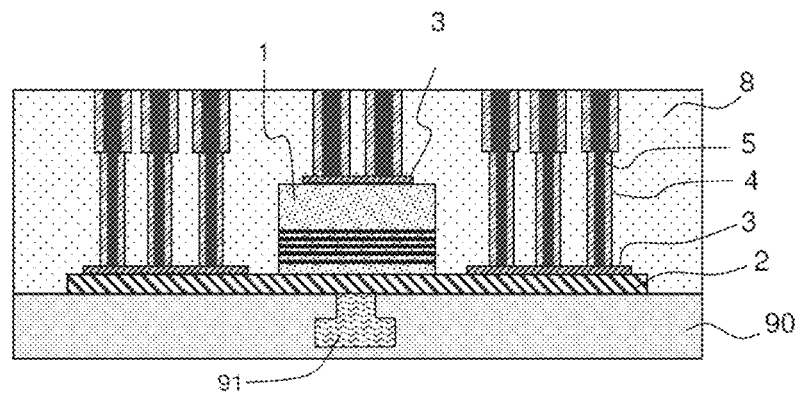
FIG. 18 illustrates a first example of a laser component produced by the process of the invention.

This example of a laser is illustrated in FIG. 18.

Example of a Vertically Emitting Laser Component of the VCSEL Type

It may be recalled that in general, a vertical-cavity surface-emitting laser diode, or VCSEL, is a type of semiconductor diode laser emitting a laser beam perpendicularly to the surface, in contrast to the conventional edge-emitting semiconductor lasers.

This example of a laser mainly comprises the same type of structure as that described in the preceding example.

However, in order to allow emission of laser radiation at the top of the structure, the upper contact is made circular.

This example of a component comprises a silicon substrate 9 on top of which the following are produced: a base of second III-V material 2, which may be of n-doped InP, and a mesa 1 comprising a multiple quantum well structure that may be based on InGaAsP, AlGaAs, GaAs, InGaAsN and a layer of p-doped InGaAs, the nature of the III-V materials determining the emission wavelength.

The dielectric 8 may be of SiN, $SiO_2$, or of polymer of the planarizing type for example based on BCB.

The contact bottom metallization 3 may be for example of Ni, Ti, or alloys thereof ($Ni_2P$, $Ni_3P$, NiGe, TiP, TiGe, etc.).

The diffusion barrier to F and/or the keying layer to W 4 may be of TiN, Ti/TiN, TaN, Ta/TaN, W.

The filling metal 5 may be Cu or Al, AlCu, AlSi.

The metallizations 3 and the elements 4 and 5 constitute the contacts $C_{sup}$ and $C_{inf}$.

Owing to the circular upper contact $C_{sup}$, the laser beam may be extracted from the upper surface of the component.

Figure 19:
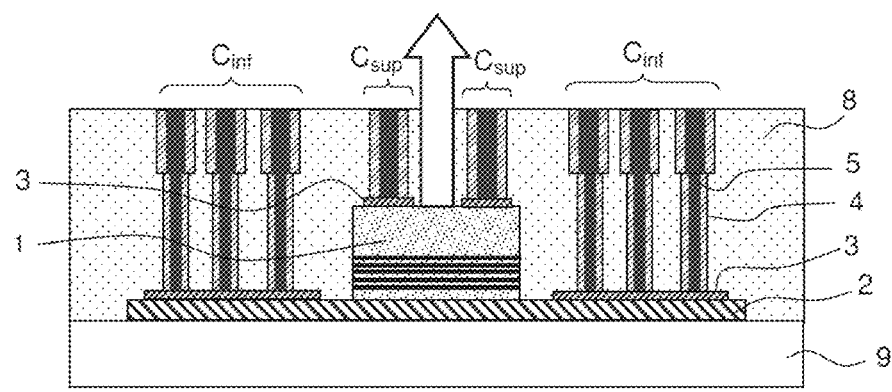
FIG. 19 illustrates a second example of a laser component produced by the process of the invention.

This example of a laser is illustrated in FIG. 19.

For the laser components described above, the integration of planar contacts typically opens the route to 3D integration, by means of hybrid or direct bonding (for example photonic/electronic) or chip transfer by means of bumps.

In the context of III-V/Si co-integration, production of a planarized back-end also allows connection to be envisaged on the devices of the lower levels (back-end front side or intermetallic for example).

Figure 20:
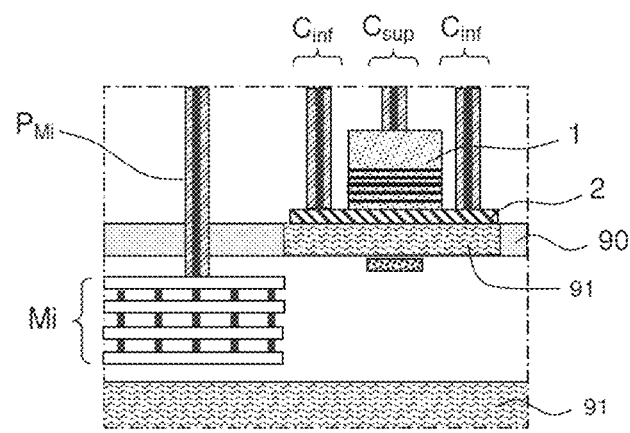
FIG. 20 illustrates an example of a component obtained by the process of the invention in the context of photonic integration.

An example is given in FIG. 20 in the context of photonic integration with production of the assembly of contacts described above $C_{sup}$ and $C_{inf}$, on the III-V component (laser) and on the back-end of the silicon part. The additional contacts are provided by the pads $P_{mi}$ which connect metallic levels Mi, integrated in dielectric 8. Typically, the substrate 91 may be silicon, and the dielectric 90 may be $SiO_2$.

Figure 21:
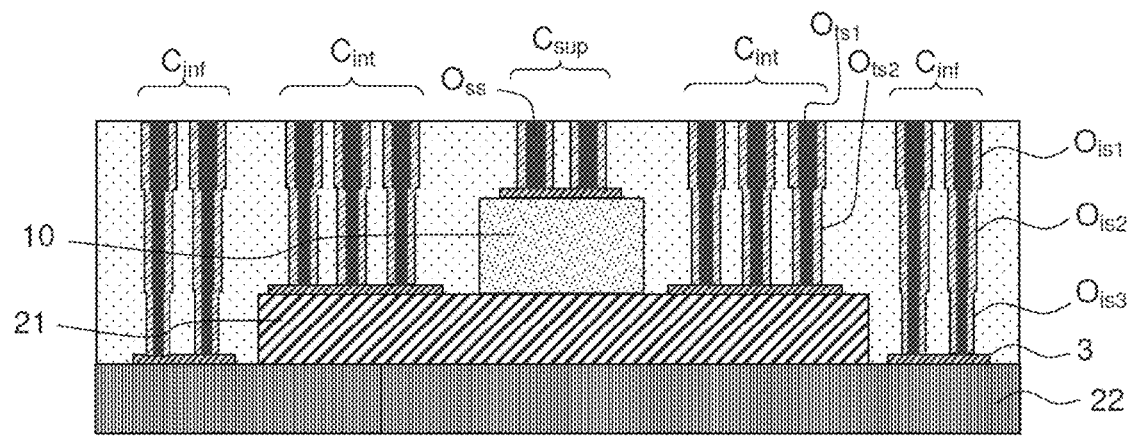
FIG. 21 illustrates an example of a component that is absorbent in different wavelength regions owing to the use of at least three levels of different III-V materials, and produced by the process of the invention.

Example of a Component Used in Applications of the Solar Cell Type in which a Series of Different III-V Materials is Stacked, Making it Possible to Diversify the Emission Wavelengths This example of a component comprises a silicon substrate 9, on top of which the following are stacked, as illustrated in FIG. 21:
- a III-V material 22 located at a so-called lower level;
- a III-V material 21 located at a so-called intermediate level;
- a III-V material 10 located at a so-called upper level.

The component comprises:
- contacts $C_{inf}$ of material 22;
- contacts $C_{inf}$ of material 21;
- contacts $C_{sup}$ of materials 10.

The contacts $C_{inf}$ are produced by filling the stack of apertures made successively: $O_{is1}$, $O_{is2}$ and $O_{is3}$.

The contacts $C_{int}$ are produced by filling the stack of apertures made successively: $O_{ts1}$, $O_{ts2}$.

The contacts $C_{sup}$ are produced by filling the aperture: $O_{ss}$.

Typically, the III-V materials used may notably be: InGaAsN, BInGaAs, InGaN, GaInP, GaInAsP, GaAs.

Figure 22:
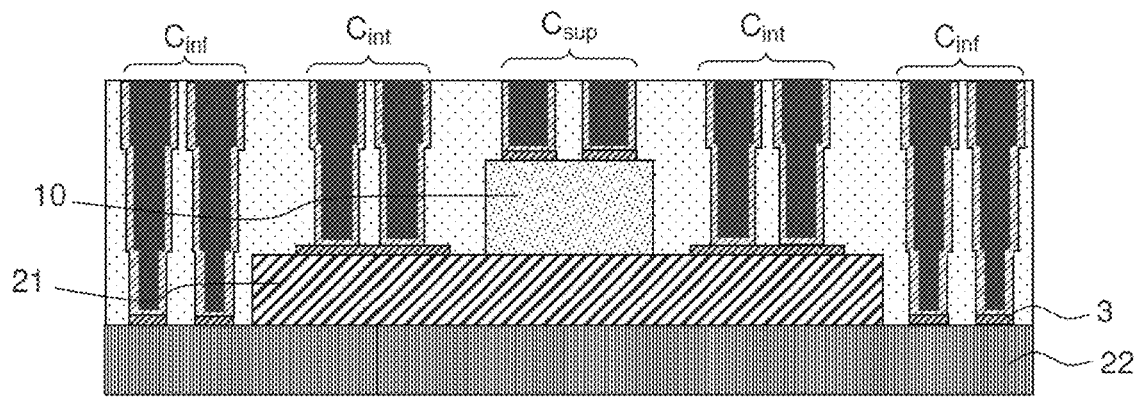
FIG. 22 illustrates an example of a component in which the contacts are formed on a solar cell in which multiplication and diversification of the III-V materials gives access to a wider absorption band.

A variant of the example illustrated in FIG. 21 is illustrated in FIG. 22 and shows a mixed solution of the two alternatives described above: apertures of a single type on two of the III-V materials 10 and 22 and primary apertures and secondary apertures on the other III-V material 21.

The contacts are produced on two III-V materials of different natures (InP and InGaAs) with different types of doping. Regardless of the contact produced, by solid-state reaction or simply by deposition of the electrode, the interface resistivity Rc is different.

When the interface resistivity Rc is low and the transfer length is smaller than the secondary aperture, only a single aperture may be made for contacting the III-V material.

Otherwise it is necessary to make a double aperture. It is possible to have both conditions on both layers III-V and therefore in certain cases it is possible to adopt a solution mixing the two alternatives.

The solution consisting of making a single type of aperture is still a favored solution when it is adapted as it minimizes the number of steps and there is a single set of operations (photo/litho/etching).

The applicant explains below the conditions for choosing between the two alternatives for making the contact:
  a single type of aperture for carrying out the contact bottom metallization and filling;
  two types of aperture: a very large primary aperture for metallization and
  then secondary apertures for making the contact and filling.

The criterion of choice is the transfer length. This length is the length that will be necessary and therefore traversed by the lines of the electric field for passing from the metallic contact in the III/V semiconductor.

Figure 23A:
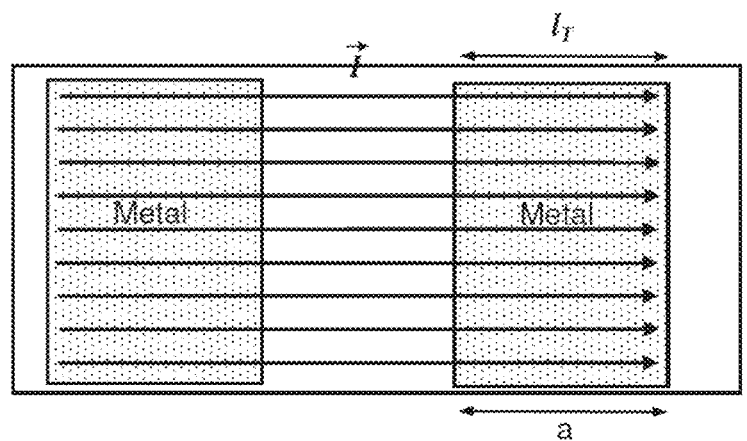
FIGS. 23a and 23b show two schematic views of contacts and the electric field lines for illustrating the transfer lengths.
Figure 23B:
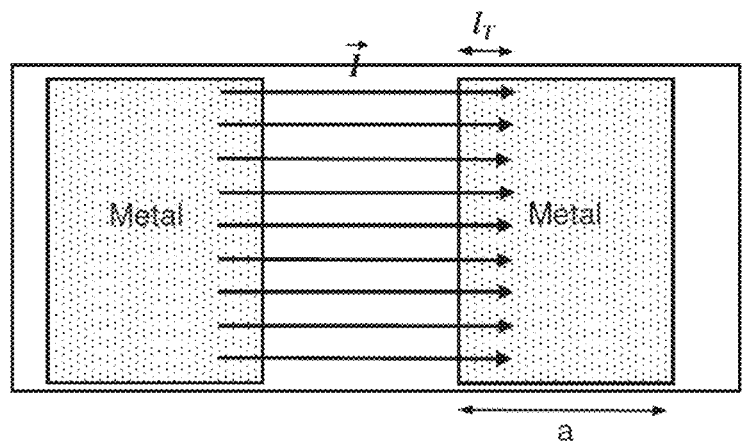

FIGS. 23a and 23b shows two contacts with the reference Metal and electric field lines that pass from one electrode to the other, passing through the semiconductor substrate.

The transfer length is defined by the distance (as well as the area) of injection of the carriers between the edges of the metal pads, Lt, which is used for injecting the current into the semiconductor:

$$L_T = \sqrt{\frac{\rho_C}{R_{SK}}}$$

This distance depends essentially on two parameters: the contact resistivity $\rho_c$ and the sheet resistance of the underlying substrate in contact.

With these elements, it is understood that:
  if the length $L_t$ is less than the dimension of the secondary apertures ($L_t<a$), integration may be envisaged with this type of aperture alone: contact bottom metallization and filling;
  if the length $L_t$ is greater than the dimension of the secondary apertures (Lt>a), in this case two types of apertures should be adopted, metallization of a larger surface, which in the context of the present patent application is greater than the dimension Lt, and then smaller secondary apertures for filling.

The transfer length is measured experimentally by making simple structures (TLM) that give access to this quantity directly. It is sufficient to make pads on the doped semiconductor and measure the current between each of these pads.

Figure 24:
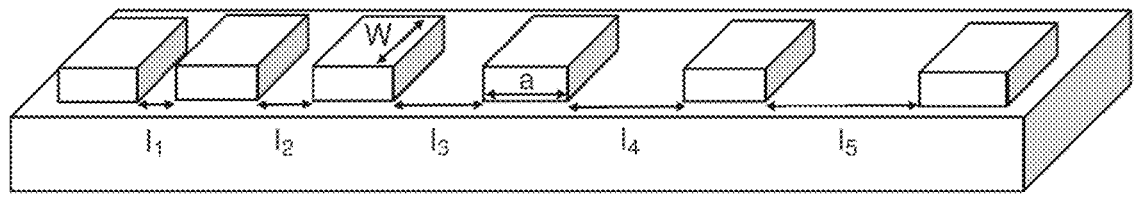
FIG. 24 shows a schematic representation of a TLM structure.

FIG. 24 shows schematically this type of TLM structure with identical contacts with surface area dimensions W.a, separated by increasing distances li, W being the width of the contact, defined as being perpendicular to the lines of the electric field.

Figure 25:
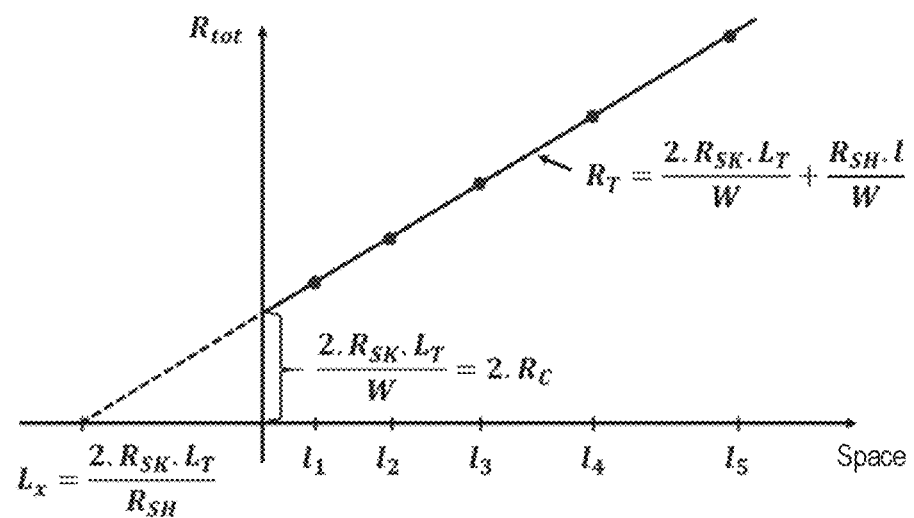
FIG. 25 illustrates the evolution of the total resistance measured as a function of the space between contacts in the case of a TLM structure.

By plotting the resistance as a function of the distance, a straight line is obtained if the contacts have low resistance and at the intersection of this straight line with the ordinate the following is obtained: 2× the contact resistance and at the intersection with the abscissa: 2× the transfer length, as shown in FIG. 25, assuming $R_{sh}=R_{sk}$ (resistance under the pad), the total resistance corresponding to the contact resistances, the sheet resistances and the resistance of the substrate.

Although approximate in the context of the contacts obtained by solid-state reaction, this method is sufficiently accurate for distinguishing the two cases of interest and making the optimum choice of integration.

It should be noted that if Lt>a, the simplest and least expensive integration may nevertheless be selected by making a compromise on the total resistance of the device provided the latter remains acceptable for operation of said device (desired performance and acceptable heating for the life of the device in question).

The invention claimed is:

1. A process for producing a component comprising a structure of III-V material(s) on the surface of a substrate, said structure comprising at least one upper contact level defined on the surface of a first III-V material and a lower contact level defined on the surface of a second III-V material, comprising:
  successive operations of encapsulation with at least one dielectric comprising encapsulation of said structure with at least one dielectric;
  making, in said dielectric, at least one upper aperture on the surface of said first III-V material and at least one lower aperture on the surface of said second III-V material, so as to define contact bottom zones on said first III-V material and on said second III-V material;
  the encapsulation with at least one dielectric being made before the at least one upper aperture and the at least one lower aperture;
  carrying out contact bottom metallizations in said at least upper aperture and in said at least lower aperture; and
  at least partial filling of said at least upper aperture and at least partial filling of said at least lower aperture with at least one metallic material so as to produce at least one upper contact pad and at least one lower contact pad;
  the contact bottom metallizations and the contact pads defining at least one upper contact of said first III-V material in contact with said upper contact level and at least one lower contact of said second III-V material in contact with said lower contact level;
  the contact bottom metallizations and the metallic material having different nature;
  at least said upper contact and at least said lower contact are integrated in dielectric and have an upper surface defined in one and the same plane;
  wherein the structure has a lower base of second III-V material and a mesa of first III-V material located above said base.

2. The production process as claimed in claim 1, wherein said process comprises successively making at least one lower aperture and then at least one upper aperture.

3. The process as claimed in claim 2, wherein at least said lower aperture is made in several steps defining a first lower aperture and a second lower aperture, superposed on one another.

4. The process as claimed in claim 2, wherein said lower aperture comprises, superposed, a contact bottom metallization, a metallic filling, a metallic interface identical to the contact bottom metallization, a metallic filling.

5. The production process as claimed in claim 1, wherein said process comprises successively making at least one upper aperture and then at least one lower aperture.

6. The production process as claimed in claim 1, wherein said process comprises simultaneously making at least one upper aperture and at least one lower aperture.

7. The production process as claimed in claim 1, wherein the width of at least said upper aperture and/or of at least said lower aperture is between 0.5 µm and 10 µm or between 1 µm and 5 µm.

8. The production process as claimed in claim 1, comprising:
- making at least one primary upper aperture on the surface of said first III-V material and at least one primary lower aperture on the surface of said second III-V material;
- carrying out contact bottom metallizations in said at least primary upper aperture and in said at least primary lower aperture;
- encapsulation of said at least primary upper aperture and of said at least primary lower aperture with at least one dielectric;
- making at least one secondary upper aperture in the dielectric located in said at least primary upper aperture, and making at least one secondary lower aperture in the dielectric located in said primary lower aperture;
- filling said at least secondary upper aperture and said at least secondary lower aperture with at least one metallic material so as to produce at least one upper contact pad and at least one lower contact pad; and
- filling said at least upper aperture and said at least lower aperture with at least one metallic material so as to produce at least one upper contact pad and at least one lower contact pad.

9. The production process as claimed in claim 8, wherein said process comprises successively making at least one primary upper aperture and then at least one primary lower aperture.

10. The production process as claimed in claim 8, wherein said process comprises simultaneously making at least one secondary upper aperture and at least one secondary lower aperture.

11. The production process as claimed in claim 8, wherein said process comprises:
- encapsulation of an assembly comprising the III-V material covered with a metallization and the III-V material covered with a metallization, with dielectric;
- making at least one secondary lower aperture opposite the second III-V material;
- making at least one secondary upper aperture above said first III-V material and making at least one additional secondary lower aperture above at least said secondary lower aperture; and
- filling at least said secondary upper aperture, at least one additional secondary lower aperture and at least said secondary lower aperture.

12. The production process as claimed in claim 8, wherein the structure comprising at least one so-called upper III-V material, a so-called intermediate III-V material, a second so-called lower III-V material, the process comprises:
- making at least one primary upper aperture, at least one primary intermediate aperture, at least one primary lower aperture; and
- making at least one secondary upper aperture, at least one secondary intermediate aperture and at least one secondary lower aperture; filling said apertures.

13. The production process as claimed in claim 12, wherein:
- at least said secondary lower aperture comprises three portions with different dimensions;
- at least said secondary intermediate aperture comprises two portions with different dimensions;
- at least said secondary upper aperture comprises a portion.

14. The production process as claimed in claim 8, wherein said process comprises the following steps:
- encapsulating said structure with a first dielectric;
- making at least one primary lower aperture opening onto said second III-V material;
- depositing metallization on the surface of said first dielectric and on the surface of said second III-V material defining a lower contact bottom metallization and a first assembly;
- encapsulation of said first assembly with a second dielectric;
- planarization of said encapsulated first assembly;
- making at least one secondary lower aperture opening onto said lower contact bottom metallization;
- filling, with at least one metallic material, said at least secondary lower aperture defining at least one contact pad of said lower contact and a second assembly:
- encapsulation of said second assembly with a third dielectric; making at least one primary upper aperture above said first III-V material;
- depositing metallization on the surface of said third dielectric material and of said upper aperture defining an upper contact bottom metallization and a third assembly;
- encapsulation of said third assembly with a fourth dielectric; planarization of said third assembly;
- making at least one secondary upper aperture above said upper contact bottom metallization and at least one upper aperture above at least said contact pad of said lower contact; and
- filling, with at least one metallic material, said at least secondary upper aperture above said upper contact bottom metallization and said at least upper aperture above at least said contact pad of said lower contact, defining at least one upper pad for upper contact and at least one prolongation of lower contact pad, said upper contact and at least said lower contact having a surface defined in one and the same plane.

15. The production process as claimed in claim 8, wherein said process comprises the following steps:
- encapsulation of said structure with a first dielectric;
- making at least one primary upper aperture opening onto said first III-V material;
- depositing metallization on the surface of said first dielectric and on the surface of said first III-V material defining an upper contact metallization and a first assembly;
- encapsulation of said first assembly with a second dielectric; planarization of said encapsulated first assembly;
- making at least one secondary upper aperture opening onto said upper contact bottom metallization;

filling, with at least one metallic material, said at least secondary upper aperture defining at least one contact pad of said upper contact and a second assembly;

making at least one primary lower aperture above said second III-V material;

depositing metallization on the surface of said first dielectric material and of said primary lower aperture defining a lower contact metallization and a third assembly;

encapsulation of said third assembly with a fourth dielectric;

planarization of said third assembly;

making at least one secondary lower aperture above said lower contact bottom layer; and filling said at least secondary lower aperture, defining at least one lower contact pad, said upper contact and at least said lower contact having a surface defined in one and the same plane.

16. The production process as claimed in claim 8, wherein said process comprises:

simultaneously making at least one primary upper aperture and at least one primary lower aperture; and simultaneously making at least one secondary upper aperture and at least one secondary lower aperture.

17. The production process as claimed in claim 1, wherein said process comprises making an additional contact level on the surface of said planar contacts, comprising:

additional deposition of dielectric;

making at least one lower additional aperture and at least one upper additional aperture; and filling said additional apertures with at least one metallic material to define at least one lower additional contact and at least one upper additional contact.

18. The production process as claimed in claim 8, wherein the primary lower apertures have a width between 20 μm and 50 μm; and the secondary lower apertures have a width between 0.5 μm and 5 μm or between 1 μm and 3 μm.

19. The production process as claimed in claim 8, wherein the primary lower apertures have a width between 20 μm and 50 μm; the secondary lower apertures have a width between 0.5 μm and 5 μm or between 1 μm and 3 μm.

20. The production process as claimed in claim 1, wherein the first III-V material and/or the second III-V material are selected from the group consisting of: InP, $In_{1-x}Ga_xAs$ (with $0 \leq x \leq 1$), GaAs, InAs, GaSb, $In_{1-x}Ga_xSb$, $In_xGa_{1-x}As_{1-y}P_y$, $Ga_{1-x}In_xP$, $In_xGa_{1-x}As_{1-y}N_y$, and $B_xIn_yGa_{1-x-y}As$.

21. The production process as claimed in claim 1, wherein the substrate is of silicon.

22. The production process as claimed in claim 1, wherein the dielectric or dielectrics are selected from the group consisting of: SiN, $SiO_2$, $Al_2O_3$, a planarizing polymer, and a planarizing polymer based on benzocyclobutene or SOG.

23. The production process as claimed in claim 1, wherein a metal such as $Ni_2P$, $Ni_3P$, NiGe, TiP, TiGe is deposited in said primary apertures.

24. The production process as claimed in claim 1, wherein a metal such as Ni, Ti and alloy such as NiPt, NiTi, NiCo are deposited in said primary apertures.

25. The production process as claimed in claim 1, wherein the deposition of metallization is followed by a heat treatment to form one or more intermetallic compounds.

26. The production process as claimed in claim 1, wherein the filling operations comprise:

depositing a diffusion barrier, which may consist of one or more layers of material selected from: TiN, Ti/TiN, TaN, Ta/TaN, W; and depositing a filling metal selected from: W, Cu, Al, AlCu, AlSi.

27. The production process as claimed in claim 1, wherein the component is a laser, and said process comprises an operation for making a guide of semiconductor material, which comprises Si, in a dielectric substrate, which comprises of $SiO_2$.

28. The production process as claimed in claim 1, wherein the component is a laser, and said process comprises making a circular upper contact to allow vertical emission of the laser radiation, at the center of said upper contact.

29. A component obtained according to the process as claimed in claim 1.

30. A process for producing a component comprising a structure of III-V material(s) on the surface of a substrate, said structure comprising at least one upper contact level defined on the surface of a first III-V material and a lower contact level defined on the surface of a second III-V material, comprising:

successive operations of encapsulation with at least one dielectric comprising encapsulation of said structure with at least one dielectric;

making, in said dielectric, at least one upper aperture on the surface of said first III-V material and at least one lower aperture on the surface of said second III-V material, so as to define contact bottom zones on said first III-V material and on said second III-V material;

the encapsulation with at least one dielectric being made before the at least one upper aperture and the at least one lower aperture;

depositing a layer of metal on the dielectric of the encapsulation made before the at least one upper aperture and the at least one lower aperture comprising:

carrying out contact bottom metallizations in said at least upper aperture and in said at least lower aperture, carrying out metallization on the surface of the dielectric at least partial filling of said at least upper aperture and at least partial filling of said at least lower aperture with at least one metallic material so as to produce at least one upper contact pad and at least one lower contact pad; and a step of removal of the metallization on the surface of the dielectric;

the contact bottom metallizations and the contact pads defining at least one upper contact of said first III-V material in contact with said upper contact level and at least one lower contact of said second III-V material in contact with said lower contact level;

at least said upper contact and at least said lower contact are integrated in dielectric and have an upper surface defined in one and the same plane.

* * * * *